US009417809B1

(12) United States Patent
Camp et al.

(10) Patent No.: US 9,417,809 B1
(45) Date of Patent: Aug. 16, 2016

(54) EFFICIENT MANAGEMENT OF PAGE RETIREMENT IN NON-VOLATILE MEMORY UTILIZING PAGE RETIREMENT CLASSES

(71) Applicant: INTERNATIONAL BUSINESS MACHINES CORPORATION, Armonk, NY (US)

(72) Inventors: Charles J. Camp, Sugar Land, TX (US); Timothy J. Fisher, Houston, TX (US); Nikolas Ioannou, Zurich (CH); Roman A. Pletka, Zurich (CH); Sasa Tomic, Zurich (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/960,704

(22) Filed: Dec. 7, 2015

(51) Int. Cl.
G06F 3/06 (2006.01)
(52) U.S. Cl.
CPC .............. G06F 3/0619 (2013.01); G06F 3/064 (2013.01); G06F 3/0652 (2013.01); G06F 3/0679 (2013.01)
(58) Field of Classification Search
None
See application file for complete search history.

(56) References Cited

U.S. PATENT DOCUMENTS

| 2006/0149892 | A1 | 7/2006 | McFarling |
| 2010/0287410 | A1 | 11/2010 | Li |
| 2014/0181377 | A1* | 6/2014 | Kimmel ............ G06F 12/0246 711/103 |
| 2014/0244912 | A1 | 8/2014 | Birk et al. |
| 2014/0281152 | A1 | 9/2014 | Karamcheti et al. |
| 2015/0149818 | A1* | 5/2015 | Kalavade ............ G06F 11/0751 714/6.13 |
| 2015/0154061 | A1 | 6/2015 | Camp et al. |
| 2016/0110111 | A1* | 4/2016 | Song ..................... G06F 3/0607 711/103 |

FOREIGN PATENT DOCUMENTS

EP 2162822 B1 6/2011
WO 2015083308 A1 6/2015

OTHER PUBLICATIONS

Tang, Dong, et al; "Assessment of the effect of memory page retirement on system RAS against hardware faults." In Dependable Systems and Networks, 2006. DSN 2006. International Conference on, pp. 365-370. IEEE, 2006.

* cited by examiner

*Primary Examiner* — Denise Tran
(74) *Attorney, Agent, or Firm* — Brian F. Russell; Randall J. Bluestone

(57) ABSTRACT

A data storage system includes a controller that controls a non-volatile memory array including a plurality of blocks each including a plurality of physical pages. The controller implements multiple pattern-based page retirement classes, where each of a plurality of the pattern-based page retirement classes is defined by a respective one of a plurality of different patterns of page indices of physical pages within the plurality of blocks that are to be considered retired from use. For each block among the plurality of blocks, the controller updates an indication of a page retirement class to which the block belongs in response to detection of a retirement-causing error in a data page stored in a physical page of the block. The controller forms block stripes for storing data from the plurality of blocks based on at least the page retirement classes of the blocks.

20 Claims, 17 Drawing Sheets

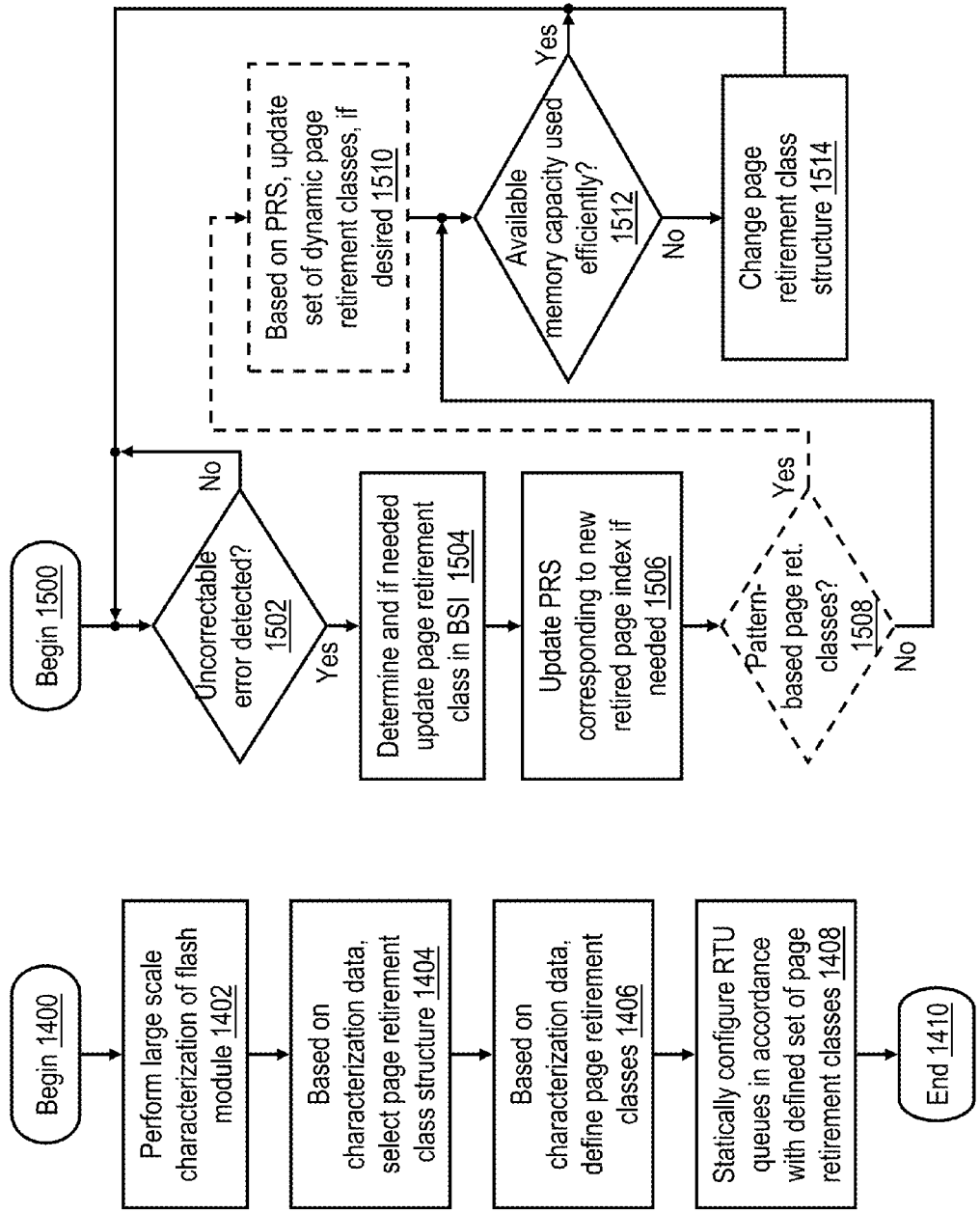

EFFICIENT MANAGEMENT OF PAGE RETIREMENT IN NON-VOLATILE MEMORY UTILIZING PAGE RETIREMENT CLASSES

BACKGROUND OF THE INVENTION

This disclosure relates to data processing and storage, and more specifically, to management of a non-volatile memory system, such as a flash memory system, to support efficient management of page retirement utilizing page retirement classes.

NAND flash memory is an electrically programmable and erasable non-volatile memory technology that stores one or more bits of data per memory cell as a charge on the floating gate of a transistor or a similar charge trap structure. In a typical implementation, a NAND flash memory array is organized in blocks (also referred to as "erase blocks") of physical memory, each of which includes multiple physical pages each in turn containing a multiplicity of memory cells. By virtue of the arrangement of the word and bit lines utilized to access memory cells, flash memory arrays can generally be programmed on a page basis, but are erased on a block basis.

As is known in the art, blocks of NAND flash memory must be erased prior to being programmed with new data. A block of NAND flash memory cells is erased by applying a high positive erase voltage pulse to the p-well bulk area of the selected block and by biasing to ground all of the word lines of the memory cells to be erased. Application of the erase pulse promotes tunneling of electrons off of the floating gates of the memory cells biased to ground to give them a net positive charge and thus transition the voltage thresholds of the memory cells toward the erased state. Each erase pulse is generally followed by an erase verify operation that reads the erase block to determine whether the erase operation was successful, for example, by verifying that less than a threshold number of memory cells in the erase block have been unsuccessfully erased. In general, erase pulses continue to be applied to the erase block until the erase verify operation succeeds or until a predetermined number of erase pulses have been used (i.e., the erase pulse budget is exhausted).

A NAND flash memory cell can be programmed by applying a positive high program voltage to the word line of the memory cell to be programmed and by applying an intermediate pass voltage to the memory cells in the same string in which programming is to be inhibited. Application of the program voltage causes tunneling of electrons onto the floating gate to change its state from an initial erased state to a programmed state having a net negative charge. Following programming, the programmed page is typically read in a read verify operation to ensure that the program operation was successful, for example, by verifying that less than a threshold number of memory cells in the programmed page contain bit errors. In general, program and read verify operations are applied to the page until the read verify operation succeeds or until a predetermined number of programming pulses have been used (i.e., the program pulse budget is exhausted).

Some NAND flash memories, referred to in the art as Single Level Cell (SLC), support only two charge states, meaning that only one bit of information can be stored per memory cell. Other NAND flash memories, referred to as Multi-Level Cell (MLC), Three Level Cell (TLC) and Quad Level Cell (QLC), respectively enable storage of 2, 3 or 4 bits information per cell through implementation of additional charge states. The higher storage density provided by NAND flash memories capable of storing multiple bits of information per cell often comes at the cost of higher bit error rates, slower programming times, and lower endurance (e.g., in terms of lifetime program/erase (P/E) cycle counts).

In general, it is common for subsets of a NAND flash memory exhibiting relatively high bit error rates to be retired, for example, as an error threshold is reached. While many NAND flash memories retire subsets of memory on a block-by-block basis, some NAND flash memories promote greater endurance by supporting retirement of individual physical pages of memory. However, employing sub-block granularity for retirement (and other flash management functions such as wear leveling) can lead to an undesirable increase in the amount of metadata that must be maintained as well an increase in implementation complexity.

The present application discloses a technique that provides improved endurance in a data storage system by enabling sub-block (e.g., page) retirement, while reducing the metadata required to track retired pages.

BRIEF SUMMARY

In at least one embodiment, a non-volatile memory array including a plurality of blocks each including a plurality of physical pages is controlled by a controller. The controller implements a plurality of nested page retirement classes each defined by a respective one of a plurality of different nested subsets of page indices of physical pages within the plurality of blocks that are to be considered retired from use. For each block among the plurality of blocks, the controller updating an indication of a page retirement class to which the block belongs in response to detection of a retirement-causing error in a data page stored in a physical page of the block. The controller forms block stripes for storing data from the plurality of blocks based on the page retirement classes of the blocks.

In at least one embodiment, a data storage system includes a controller that controls a non-volatile memory array including a plurality of blocks each including a plurality of physical pages. The controller implements multiple pattern-based page retirement classes, where each of a plurality of the pattern-based page retirement classes is defined by a respective one of a plurality of different patterns of page indices of physical pages within the plurality of blocks that are to be considered retired from use. For each block among the plurality of blocks, the controller updates an indication of a page retirement class to which the block belongs in response to detection of a retirement-causing error in a data page stored in a physical page of the block. The controller forms block stripes for storing data from the plurality of blocks based on at least the page retirement classes of the blocks.

BRIEF DESCRIPTION OF THE SEVERAL VIEWS OF THE DRAWINGS

FIG. 14 is a high level logical flowchart of an exemplary process for defining page retirement classes and statically configuring the RTU queues of a flash memory in accordance with the page retirement classes in one embodiment;

FIG. 15 is a high level logical flowchart of an exemplary process for dynamically selecting a page retirement class structure and building dynamic page retirement classes in accordance with one embodiment;

DETAILED DESCRIPTION

Figure 1A:
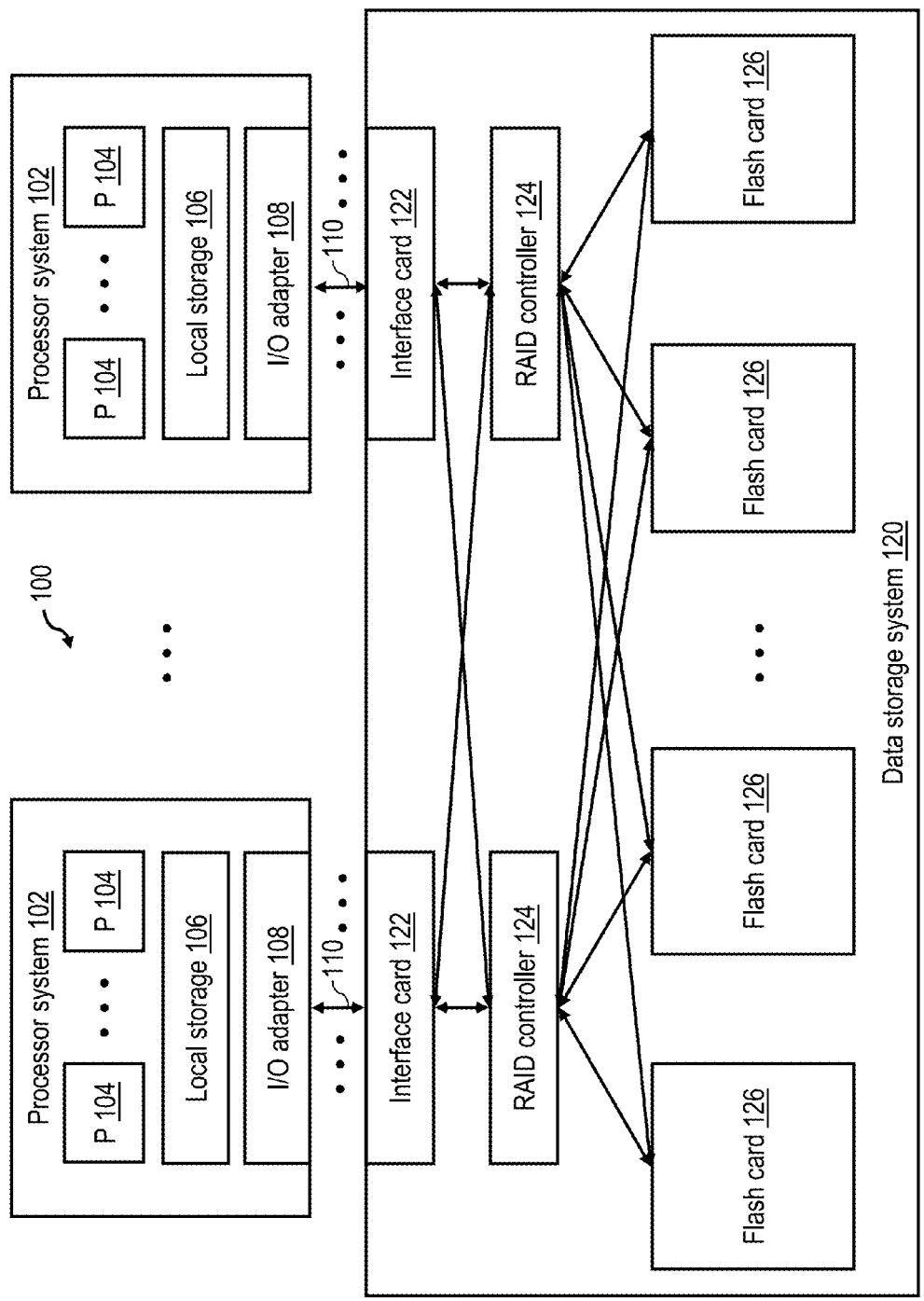
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as a processor system 102 having one or more processors 104 that process instructions and data. Processor system 102 may additionally include local storage 106 (e.g., dynamic random access memory (DRAM) or disks) that may store program code, operands and/or execution results of the processing performed by processor(s) 104. In various embodiments, processor system 102 can be, for example, a mobile computing device (such as a smartphone or tablet), a laptop or desktop personal computer system, a server computer system (such as one of the POWER series available from International Business Machines Corporation), or a mainframe computer system. Processor system 102 can also be an embedded processor system using various processors such as ARM, Power, Intel X86, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In various embodiments, an I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O operations (IOPs) communicated via I/O channel 110 include read IOPs by which a processor system 102 requests data from data storage system 120 and write IOPs by which a processor system 102 requests storage of data in data storage system 120.

In the illustrated embodiment, data storage system 120 includes multiple interface cards 122 through which data storage system 120 receives and responds to input/output operations (IOP) 102 via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to each of multiple flash cards 126 including, in this example, NAND flash storage media. In other embodiments, other lossy storage media can be employed.

Figure 1B:
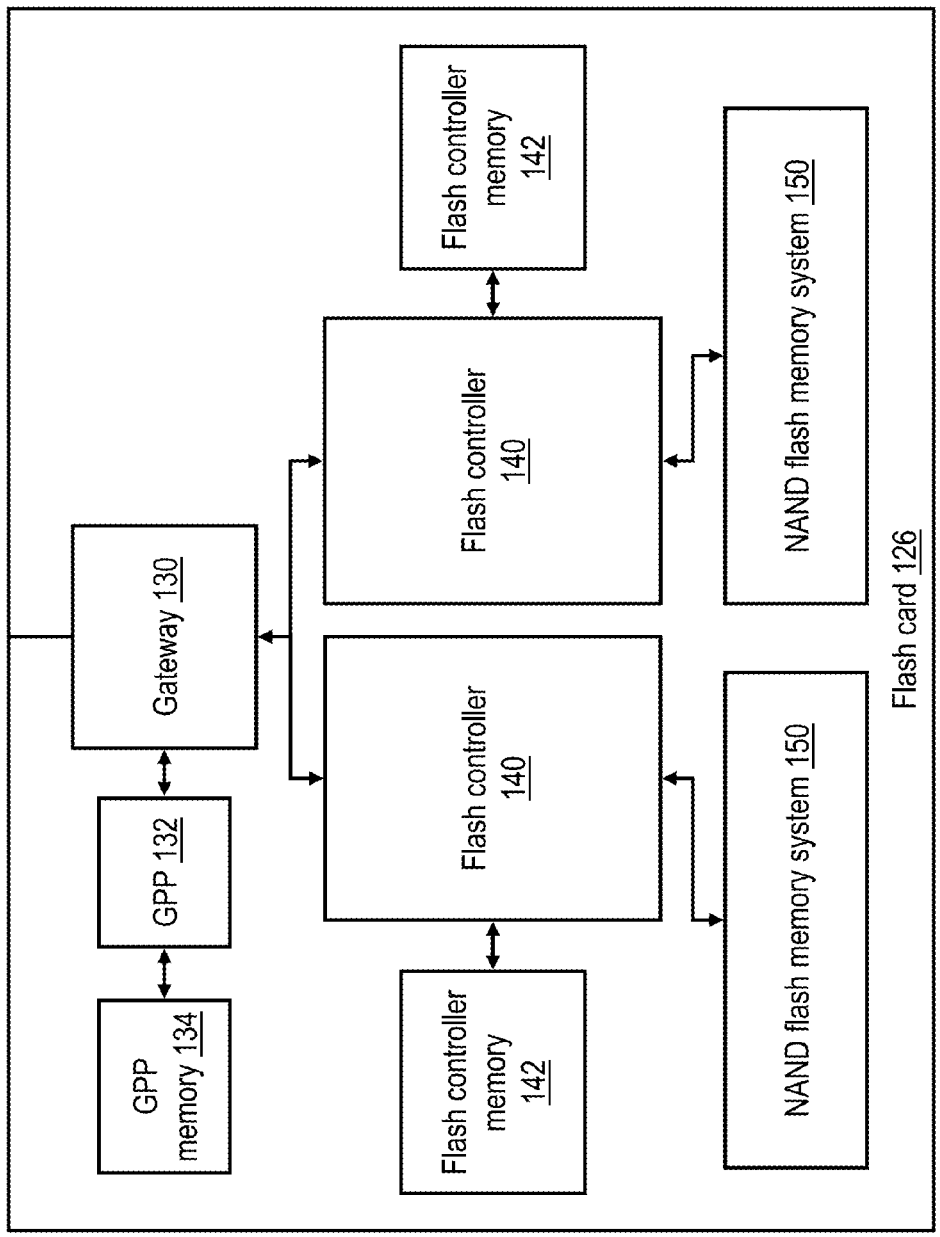
FIG. 1B is a more detailed block diagram of a flash card of the data storage system of FIG. 1A.

FIG. 1B depicts a more detailed block diagram of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform various management functions, such as pre-processing of IOPs received by gateway 130 and/or to schedule servicing of the IOPs by flash card 126. GPP 132 is coupled to a GPP memory 134 (e.g., Dynamic Random Access Memory (DRAM) or Magneto-resistive Random Access Memory (MRAM)) that can conveniently buffer data created, referenced and/or modified by GPP 132 in the course of its processing.

Gateway 130 is further coupled to multiple flash controllers 140, each of which controls a respective NAND flash memory system 150. Flash controllers 140 can be implemented, for example, by an Application Specific Integrated Circuit (ASIC) or Field Programmable Gate Array (FPGA)) having an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write IOPs from gateway 130 that request to read data stored in NAND flash memory system 150 and/or to store data in NAND flash memory system 150. Flash controllers 140 service these IOPs, for example, by accessing NAND flash memory systems 150 to read or write the requested data from or into NAND flash memory systems 150 or by accessing one or more read and/or write caches (not illustrated in FIG. 1B) associated with NAND flash memory systems 150.

Flash controllers 140 implement a flash translation layer (FTL) that provides logical-to-physical address translation to enable access to specific memory locations within NAND flash memory systems 150. In general, an IOP received by flash controller 140 from a host device, such as a processor system 102, contains the logical block address (LBA) at which the data is to be accessed (read or written) and, if a write IOP, the write data to be written to data storage system 120. The IOP may also specify the amount (or size) of the data to be accessed. Other information may also be communicated depending on the protocol and features supported by data storage system 120. As is known to those skilled in the art, NAND flash memory, such as that employed in NAND flash memory systems 150, is constrained by its construction such that the smallest granule of data that can be accessed by a read or write IOP is fixed at the size of a single flash memory page, for example, 16 kilobytes (kB). The LBA provided by the host device corresponds to a logical page within a logical address space, the page typically having a size of 4 kilobytes. Therefore, more than one logical page may be stored in a physical flash page. The flash translation layer translates this LBA into a physical address assigned to a corresponding physical location in a NAND flash memory system 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. Referring now to FIGS. 2-5, there is depicted one exemplary arrangement of physical memory within a NAND flash memory system 150 in accordance with one exemplary embodiment.

Figure 2:
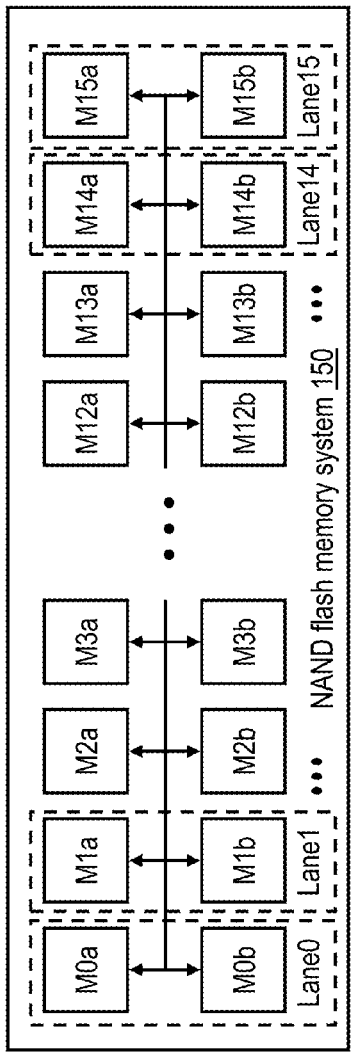
FIGS. 2-5 illustrate an exemplary arrangement of physical memory within a NAND flash memory system in accordance with the present disclosure.

As shown in FIG. 2, NAND flash memory system 150 may be formed from thirty-two (32) individually addressable NAND flash memory storage devices. In the illustrated example, each of the flash memory storage devices M0*a*-M15*b* takes the form of a board-mounted flash memory module capable of storing one or more bits per cell. Thus, flash memory modules may be implemented with Single Level Cell (SLC), Multi-Level Cell (MLC), Three Level Cell (TLC), or Quad Level Cell (QLC) memory. The thirty-two NAND flash memory modules are arranged in sixteen groups of two, (M0*a*, M0*b*) through (M15*a*, M15*b*). For purposes of the physical addressing scheme, each group of two modules forms a "lane," also sometimes referred to as a "channel," such that NAND flash memory system 150 includes sixteen channels or lanes (Lane0-Lane15).

In a preferred embodiment, each of the individual lanes has a respective associated bus coupling it to the associated flash controller 140. Thus, by directing its communications to one of the specific communication buses, flash controller 140 can direct its communications to one of the lanes of memory modules. Because each communication bus for a given lane is independent of the communication buses for the other lanes, a flash controller 140 can issue commands and send or receive data across the various communication buses at the same time, enabling the flash controller 140 to access the flash memory modules corresponding to the individual lanes at, or very nearly at, the same time.

Figure 3:
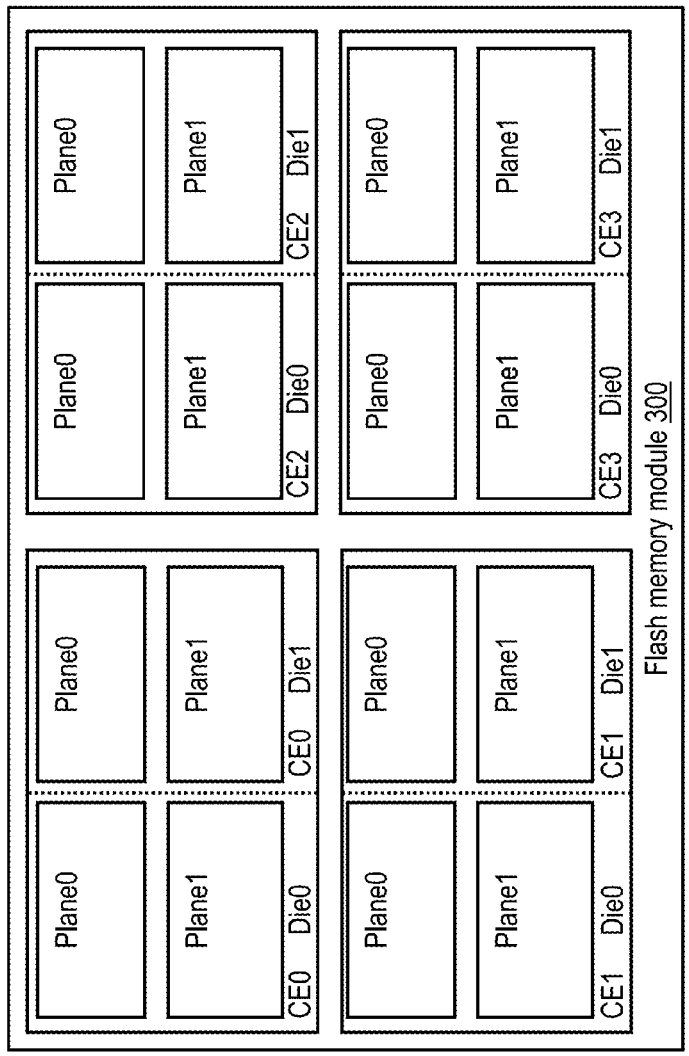

With reference now to FIG. 3, there is illustrated an exemplary embodiment of a flash memory module 300 that can be utilized to implement any of flash memory modules M0*a*-M15*b* of FIG. 2. As shown in FIG. 3, the physical storage locations provided by flash memory module 300 are further subdivided into physical locations that can be addressed and/or identified through Chip Enables (CEs). In the example of FIG. 3, the physical memory of each flash memory chip 300 is divided into four Chip Enables (CE0, CE1, CE2 and CE3), each having a respective CE line that is asserted by flash controller 140 to enable access to or from the physical memory locations within the corresponding CE. Each CE is in turn subdivided into multiple dice (e.g., Die0 and Die1) each having two planes (e.g., Plane0 and Plane1). Each plane represents a collection of blocks (described below) that, because of the physical layout of the flash memory chips, are physically associated with one another and that utilize common circuitry (e.g., I/O buffers) for the performance of various operations, such as read and write operations.

Figure 4:
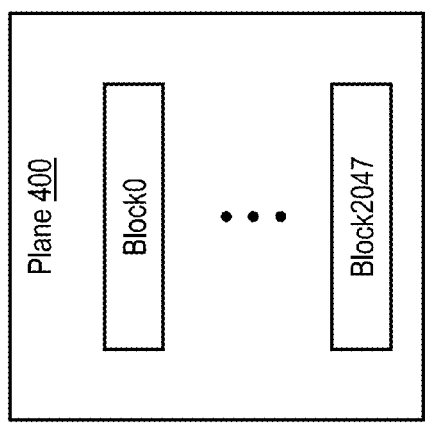
Figure 5:
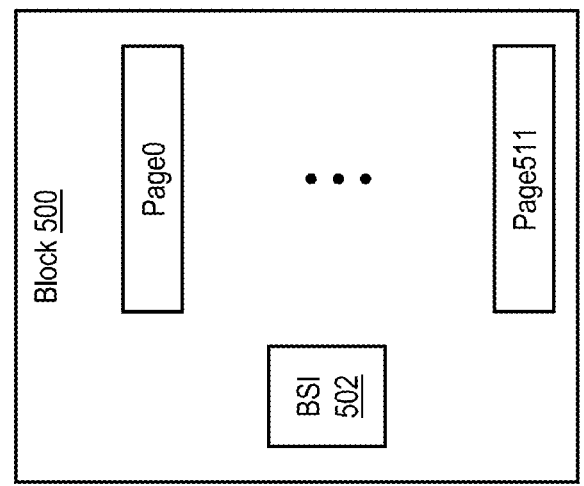

As further shown in FIGS. 4-5, an exemplary plane 400, which can be utilized to implement any of the planes within flash memory module 300 of FIG. 3, includes, for example, 1024 or 2048 blocks of physical memory. Note that manufacturers often add some additional blocks as some blocks might fail early. In general, a block 500 is a collection of physical pages that are associated with one another, typically in a physical manner. This association is such that a block is defined to be the smallest granularity of physical storage locations that can be erased within NAND flash memory system 150. In the embodiment of FIG. 5, each block 500 includes, for example, 256 or 512 physical pages, where a physical page is defined to be the smallest individually addressable data unit for read and write access. In the exemplary system, each physical page of data has a common capacity (e.g., 16 kB) for data storage plus additional storage for metadata described in more detail below. Thus, data is written into or read from NAND flash memory system 150 on a page-by-page basis, but erased on a block-by-block basis.

If NAND flash memory system 150 is implemented is a memory technology supporting multiple bits per cell, it is common for multiple physical pages of each block 500 to be implemented in the same set of memory cells. For example, assuming 512 physical pages per block 500 as shown in FIG. 5 and two bits per memory cell (i.e., NAND flash memory 150 is implemented in MLC memory), Page0 through Page255 (the lower pages) can be implemented utilizing the first bit of a given set of memory cells and Page256 through Page511 (the upper pages) can be implemented utilizing the second bit of the given set of memory cells. The actual order of lower and upper pages may be interleaved and depends on the manufacturer.

As further shown in FIG. 5, each block 500 preferably includes block status information (BSI) 502, which indicates the page retirement status of physical pages comprising that block 500 as retired (i.e., no longer used to store user data) or non-retired (i.e., active or still usable to store user data). In various implementations, BSI 502 can be collected into a single data structure (e.g., a vector or table) within block 500 and/or maintained elsewhere in data storage system 120. As one example, in the embodiment illustrated in FIG. 9 and discussed further below, the block status information of all blocks 500 in a NAND flash memory system 150 is collected in a system-level data structure, for example, a block status table (BST) 946 stored in GPP memory 134 or a flash controller memory 142.

Because the flash translation layer implemented by data storage system 120 isolates the logical address space made available to host devices from the physical memory within NAND flash memory system 150, the size of NAND flash memory system 150 need not be equal to the size of the logical address space presented to host devices. In most embodiments it is beneficial to present a logical address space that is less than the total available physical memory (i.e., to over-provision NAND flash memory system 150). Overprovisioning in this manner ensures that physical memory resources are available when the logical address space is fully utilized, even given the presence of a certain amount of invalid data as described above. In addition to invalid data that has not yet been reclaimed the overprovisioned space can be used to ensure there is enough logical space, even given the presence of memory failures and the memory overhead entailed by the use of data protection schemes, such as Error Correcting Code (ECC), Cycle Redundancy Check (CRC), and parity.

Figure 6A:
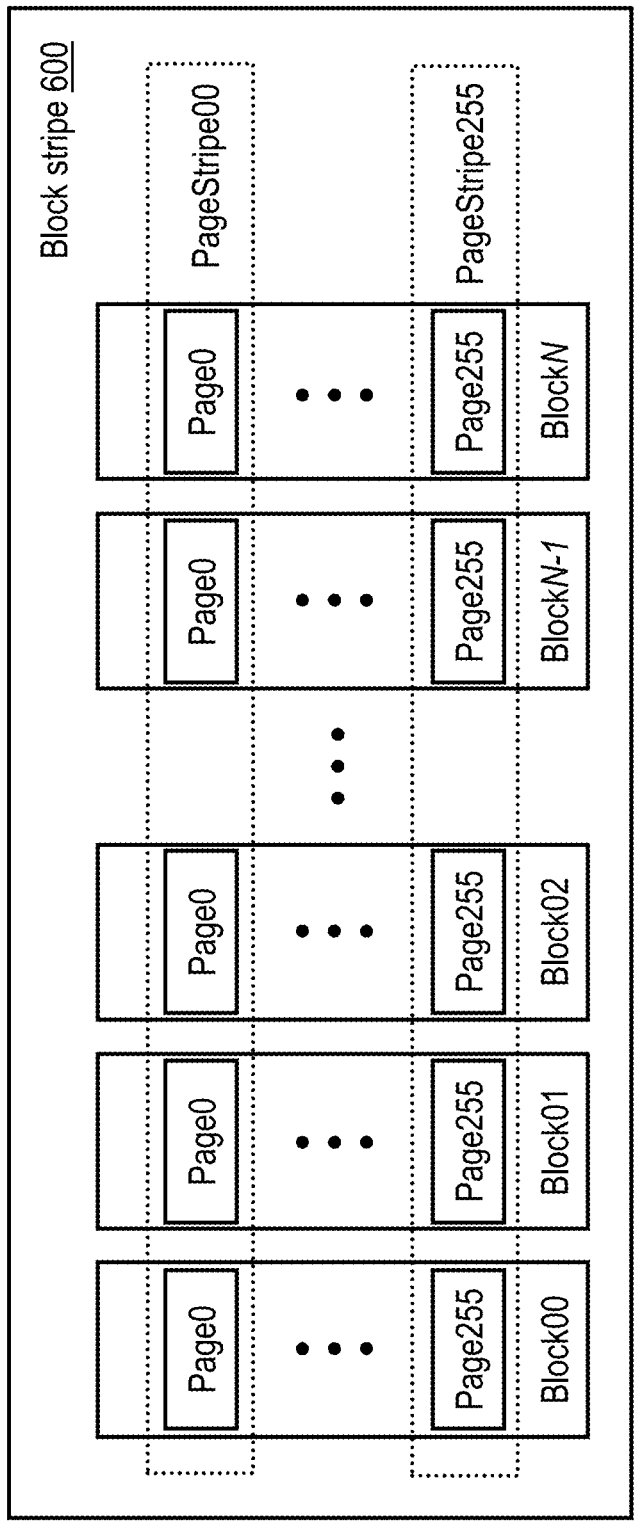
FIG. 6A depicts an exemplary implementation of a block stripe in accordance with the present disclosure.

In some embodiments, data is written to NAND flash memory system 150 one page at a time. In other embodiments in which more robust error recovery is desired, data is written to groups of associated physical pages of NAND flash memory system 150 referred to herein as "page stripes." In a preferred embodiment, all pages of a page stripe are associated with different lanes to achieve high write bandwidth. Because in many implementations the smallest erase unit is a block, page stripes can be grouped into a block stripe as is shown in FIG. 6A, where each block in the block stripe is associated with a different lane. When a block stripe is built, any free block of a lane can be chosen, but preferably all blocks within the same block stripe have the same or similar health grade. Note that the block selection can be further restricted to be from the same plane, die, and/or chip enable. The lengths of the block stripes can and preferably do vary, but in one embodiment in which NAND flash memory system 150 includes 16 lanes, each block stripe includes between two and sixteen blocks, with each block coming from a different lane. Further details regarding the construction of block stripes of varying lengths can be found in U.S. Pat. Nos. 8,176,284; 8,176,360; 8,443,136; and 8,631,273, which are incorporated herein by reference in their entireties.

Figure 6B:
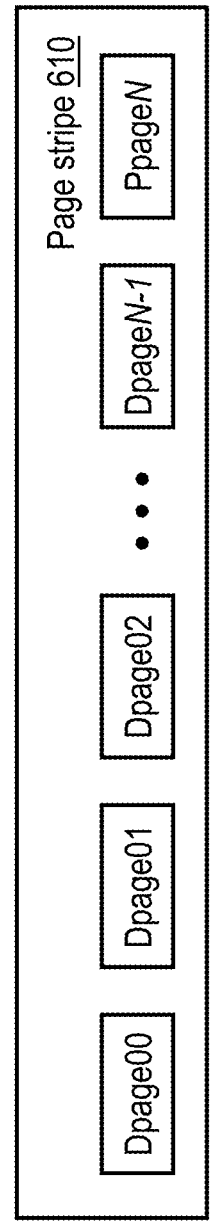
FIG. 6B depicts an exemplary implementation of a page stripe in accordance with the present disclosure.

Once a block from each lane has been selected and a block stripe is formed, page stripes are preferably formed from physical pages with the same page number (i.e., physical page index) from blocks in the block stripe. While the lengths of the various page stripes stored into NAND flash memory system 150 can and preferably do vary, in one embodiment each page stripe includes one to fifteen data pages of write data (typically provided by a host device) and one additional page (a "data protection page") used to store data protection information for the write data. For example, FIG. 6B illustrates an exemplary page stripe 610 including N data pages (i.e., Dpage00 through DpageN–1) and one data protection page (i.e., PpageN). The data protection page can be placed on any lane of the page stripe containing a non-retired page, but typically is on the same lane for all page stripes of the same block stripe to minimize metadata information. The addition of a data protection page as illustrated requires that garbage collection be performed for all page stripes of the same block stripe at the same time. After garbage collection of the block stripe completes, the block stripe can be dissolved, and each block can be placed into the relevant ready-to-use (RTU) queue as explained below.

Figures 7, 8:
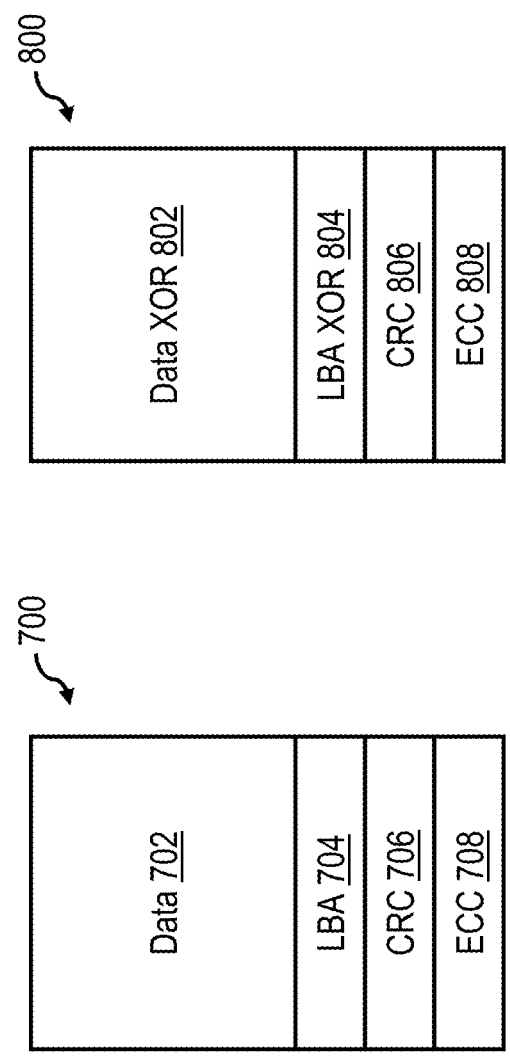
FIG. 7 illustrates an exemplary codeword stored in each data page in accordance with the present disclosure.
FIG. 8 depicts an exemplary codeword stored in each data protection page in accordance with the present disclosure.

FIG. 7 illustrates an exemplary format of a codeword stored in each data page within page stripe 610 of FIG. 6B. Typically, a positive integer number of codewords, for example, 2 or 3, are stored in each data page, but an alternative embodiment may also store a single codeword in a data page. In this example, each codeword 700 includes a data field 702, as well as additional fields for metadata describing the data page. Depending on the size of the codeword, the data field 702 holds data for one or more logical pages. In another embodiment it may also hold fractions of data of logical data pages. In the illustrated example, metadata fields include an LBA field 704 containing the LBAs stored in codeword 700, a CRC field 706 containing the CRC value computed for the combination of data field 702 and LBA field 704, and an ECC field 708 containing an ECC value calculated, in the illustrated example, from a combination of contents of data field 702, LBA field 704 and CRC field 706. In case data field 702 holds fractions of logical data pages, the LBA field 704 further holds information on which fractions of logical data pages are stored in the data field 702.

FIG. 8 depicts an exemplary format of a codeword in the data protection page of page stripe 610 of FIG. 6. In one embodiment, each data protection page stores a positive integer number of codewords, but an alternative embodiment a data protection page may store a single codeword. In the depicted example, data protection codeword 800 includes a data XOR field 802 that contains the bit-by-bit Exclusive OR (XOR) of the contents of the data fields 702 of the codewords 700 in page stripe 610. Data protection codeword 800 further includes an LBA XOR field 804 that contains the bit-by-bit XOR of the LBA fields 704 of the codewords 700 in page stripe 610. Data protection codeword 800 finally includes a CRC field 806 and ECC field 808 for respectively storing a CRC value and an ECC value for data protection codeword 800. Such a protection scheme is commonly referred to as RAID 5, since the parity field will not always be located on one particular flash plane. However, it should be appreciated that alternate data protection schemes such as Reed-Solomon can alternatively or additionally be used.

The formats for data pages and data protection pages described above protect data stored in a page stripe using multiple different data protection mechanisms. First, the use of the ECC bits in each codeword of a data page allows the correction of some number of bit errors within the codeword in a flash page. Depending on the ECC method used it may be possible correct hundreds of bits or even thousands of bits within a NAND flash page. After ECC checking and correction is performed, the corrected CRC field is used to validate the corrected data. Used together, these two mechanisms allow for the correction of relatively benign errors and the detection of more serious errors using only local intra-page information. Should an uncorrectable error occur in a data page, for example, due to failure of the physical page utilized to store the data page, the contents of the data field and LBA field of the failing data page may be reconstructed from the other data pages and the data protection page for the page stripe.

While the physical memory locations in which the data pages and data protection page of a page stripe will vary within NAND flash memory system 150, in one embodiment the data pages and data protection page that comprise a given page stripe are preferably stored in physical memory locations selected to optimize the overall operation of the data storage system 120. For example, in some embodiments, the data pages and data protection page comprising a page stripe are stored such that different physical lanes are employed to store each of the data pages and data protection page. Such embodiments support efficient access to a page stripe because flash controller 140 can access all of the pages of data that comprise the page stripe simultaneously or nearly simultaneously. It should be noted that the assignment of pages to lanes need not be sequential (i.e., data pages can be stored in any lane in any order), and unless a page stripe is a full length page stripe (e.g., containing fifteen data pages and one data protection page), the lanes utilized to store the page stripe need not be adjacent.

Having described the general physical structure and operation of one exemplary embodiment of a data storage system 120, certain operational aspects of data storage system 120 are now described with reference to FIG. 9, which is a high level flow diagram of the flash management functions and data structures employed by GPP 132 and/or flash controllers 140 in accordance with one embodiment.

As noted above, data storage system 120 does not generally allow external devices to directly address and/or access the physical memory locations within NAND flash memory systems 150. Instead, data storage system 120 is generally configured to present a single contiguous logical address space to the external devices, thus allowing host devices to read and write data to and from LBAs within the logical address space while permitting flash controllers 140 and GPP 132 to control where the data that is associated with the various LBAs actually resides in the physical memory locations comprising NAND flash memory systems 150. In this manner, performance and longevity of NAND flash memory systems 150 can be intelligently managed and optimized. In the illustrated embodiment, each flash controller 140 manages the logical-to-physical translation using a logical-to-physical translation data structure, such as logical-to-physical translation (LPT) table 900, which can be stored in the associated flash controller memory 142.

Flash management code running on the GPP 132 tracks erased blocks of NAND flash memory system 150 that are ready to be used in ready-to-use (RTU) queues 906, which may be stored, for example, in GPP memory 134. In the depicted embodiment, management code running on the GPP 132 preferably maintains one or more RTU queues 906 per channel, and an identifier of each erased block that is to be reused is enqueued in one of the RTU queues 906 corresponding to its channel.

A build block stripes function 920 performed by flash management code running on the GPP 132 constructs new block stripes for storing data and associated parity information from the erased blocks enqueued in RTU queues 906. As noted above with reference to FIG. 6A, block stripes are preferably formed of blocks of the same or similar health (i.e., expected remaining useful life) residing in different channels, meaning that build block stripes function 920 can conveniently construct a block stripe by drawing each block of the new block stripe from corresponding RTU queues 906 of different channels. The new block stripe is then queued to flash controller 140 for data placement.

In response to a write IOP received from a host, such as a processor system 102, a data placement function 910 of flash controller 140 determines by reference to LPT table 900 whether the target LBA(s) indicated in the write request is/are currently mapped to physical memory page(s) in NAND flash memory system 150 and, if so, changes the status of each data page currently associated with a target LBA to indicate that it is no longer valid. In addition, data placement function 910 allocates a page stripe if necessary to store the write data of the write IOP and any non-updated data (i.e., in case the write request is smaller than a logical page, there is still valid data which needs to be handled in a read-modify-write manner) from an existing page stripe, if any, targeted by the write IOP, and/or stores the write data of the write IOP and any non-updated (i.e., still valid) data from an existing page stripe, if any, targeted by the write IOP to an already allocated page stripe which has free space left. The page stripe may be allocated from either a block stripe already allocated to hold data or from a new block stripe built by build block stripes function 920. In a preferred embodiment, the page stripe allocation can be based on the health of the blocks available for allocation and the "heat" (i.e., estimated or measured write access frequency) of the LBA of the write data. Data placement function 910 then writes the write data, associated metadata (e.g., CRC and ECC values), for each codeword in each page of the page stripe, and parity information for the page stripe in the allocated page stripe. The associated metadata and parity information can be written to storage as soon as enough host data has been placed into the page stripe. Flash controller 140 also updates LPT table 900 to associate the physical page(s) utilized to store the write data with the LBA (s) indicated by the host device. Thereafter, flash controller 140 can access the data to service host read IOPs by reference to LPT table 900 as further illustrated in FIG. 9.

Once all pages in a block stripe have been written, flash controller 140 places the block stripe into one of occupied block queues 902, which flash management code running on the GPP 132 utilizes to facilitate garbage collection. As noted above, through the write process, pages are invalidated, and therefore portions of the NAND flash memory system 150 become unused. The associated flash controller 140 (and/or GPP 132) eventually needs to reclaim this space through garbage collection performed by a garbage collector 912. Garbage collector 912 selects particular block stripes for garbage collection based on a number of factors including, for example, the health of the blocks within the block stripes and how much of the data within the erase blocks is invalid. In the illustrated example, garbage collection is performed on entire block stripes, and flash management code running on GPP 132 logs the block stripes ready to be recycled in a relocation queue 904, which can conveniently be implemented in the associated flash controller memory 142 or GPP memory 134.

The flash management functions performed by GPP 132 or flash controller 140 additionally include a relocation function 914 that relocates the still valid data held in block stripes enqueued in relocation queue 904. To relocate such data, relocation function 914 issues relocation write requests to data placement function 910 to request that the data of the old block stripe be written to a new block stripe in NAND flash memory system 150. In addition, relocation function 914 updates LPT table 900 to remove the current association between the logical and physical addresses of the data. Once all still valid data has been moved from the old block stripe, the old block stripe is passed to dissolve block stripes function 916, which decomposes the old block stripe into its constituent blocks, thus disassociating the blocks. Flash controller 140 then erases each of the blocks formerly forming the dissolved block stripe and increments an associated program/erase (P/E) cycle count for the block in P/E cycle counts 944. Based on the health metrics of each erased block, each erased block is either retired (i.e., no longer used to store user data) by a block retirement function 918 among the flash management functions executed on GPP 132, or alternatively, prepared for reuse by placing the block's identifier on the appropriate ready-to-use (RTU) queue 906 in the associated GPP memory 134.

Figure 9:
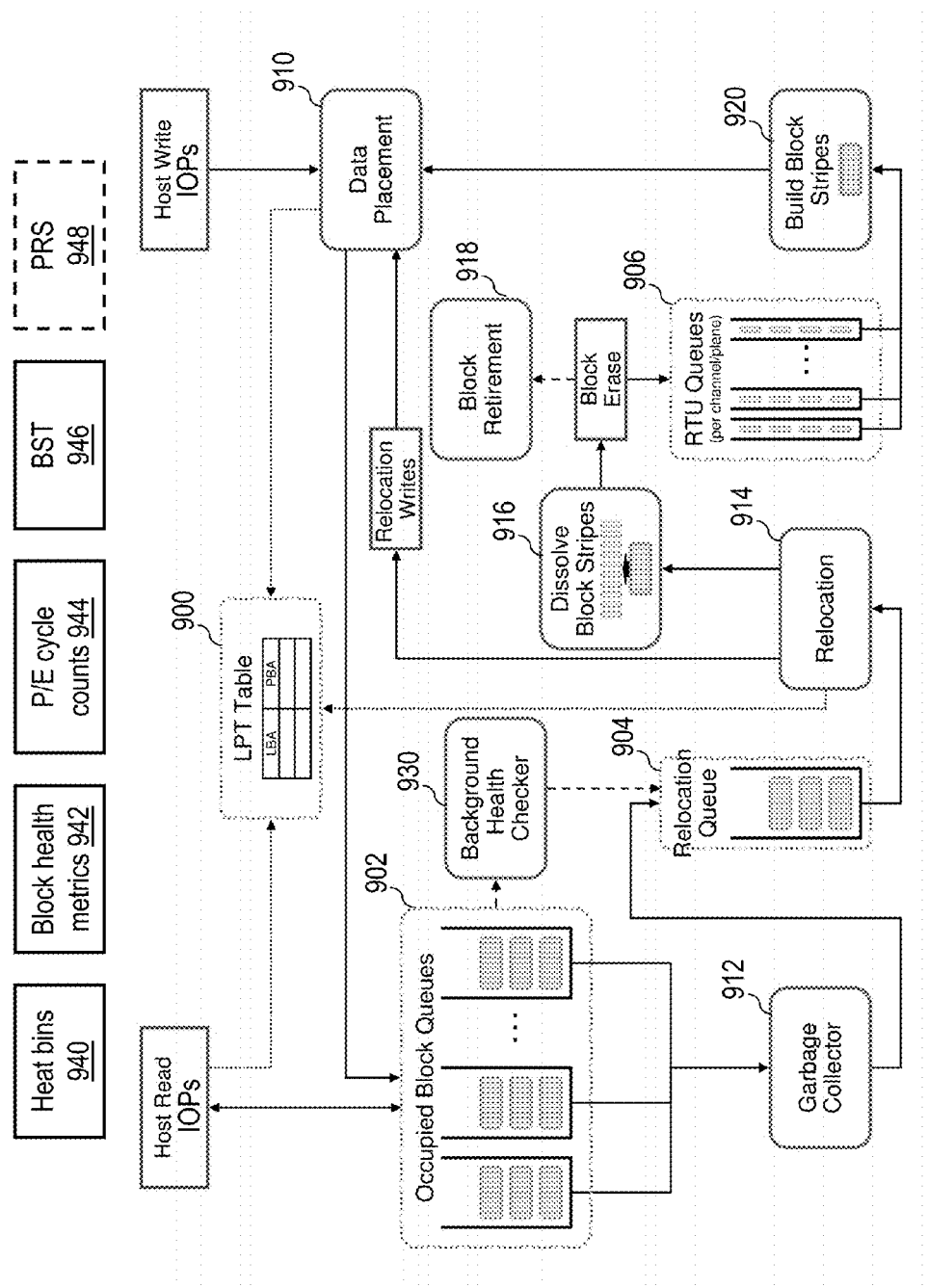
FIG. 9 is a high level flow diagram of the flash management functions and data structures employed to manage a flash memory in accordance with one embodiment.

As further shown in FIG. 9, flash management functions executed on GPP 132 include a background health checker 930. Background health checker 930, which operates independently of the demand read and write IOPs of hosts such as processor systems 102, continuously determines one or more block health metrics 942 (e.g., worst page and/or mean page bit error rate (BER), programming and read voltages, etc.) for blocks belonging to block stripes recorded in occupied block queues 902. Based on the one or more of the block health metrics 942, background health checker 930 may place block stripes on relocation queue 904 for handling by relocation function 914.

In many cases, the health of various physical regions within a NAND flash memory system exhibit dramatic variations in the probability of bit errors. For example, at a particular point in the lifetime of a NAND flash memory device, the probability of having a bit error occurring in physical page 5 of a block of a particular flash memory product could be 1%, while the probability of a bit error occurring in physical page 10 of the very same block could be 0.001%. Similar variability in the probability of bit errors can also be observed between modules, dies, planes, and blocks of the same flash memory product. To extend the useful life of a NAND flash storage device in the presence of such bit errors, it is preferred if physical regions of NAND flash memory can be retired on a granularity as small as a physical page until block retirement (e.g., as performed by block retirement function 918) becomes necessary or desirable.

As noted above, employing sub-block (e.g., page) granularity for retirement (and other flash management functions such as wear leveling), if not carefully implemented, could lead to an undesirable increase in the amount of metadata that must be maintained and to increased implementation complexity. For example, if a simple bit map were used to record page status information, a minimum of 64 bytes (i.e., 512 bits) would be required per 512-page block to indicate the status of the pages of the block as retired or active (i.e., non-retired). In future devices in which the number of physical pages per block and the number of blocks per flash memory module may increase further, the amount of physical storage required to hold the metadata would concomitantly increase. The present disclosure accordingly discloses one or more techniques for reducing the amount of metadata describing the page retirement states of blocks of physical memory while supporting efficient construction of block and page stripes.

The present disclosure also recognizes that page retirement (and the variable length page stripes that result) also introduces complexity into the construction of block and page stripes. In general, it is desirable from the standpoint of endurance, to build block stripes and page stripes from memory of the same or similar health. Thus, for example, it can be advantageous to utilize block stripes composed of healthier blocks to store data associated with more frequently updated (i.e., hotter) logical block addresses (LBAs) and to utilize block stripes composed of less healthy blocks to store data associated with less frequently updated (i.e., colder) LBAs. Further, because page stripes are conveniently formed of physical pages sharing the same page index (e.g., page 1, page 2, etc.), storage efficiency is enhanced if the blocks composing the block stripes have similar pages retired. That is, it is desirable if the pages forming a given page stripe (which preferably all have the same page index) are either all retired or all active across all blocks within the block stripe in which the page stripe is formed. A naïve approach to constructing block and page stripes from blocks of similar block health and page retirement status would be to search through all available blocks in the system to build each and every block stripe. However, for large enterprise-class systems, which potentially include millions of blocks, the computational complexity and associated latency would render such an approach unfeasible. The present disclosure accordingly discloses one or more techniques for efficiently building block and page stripes in the presence of page retirement.

Figure 10:
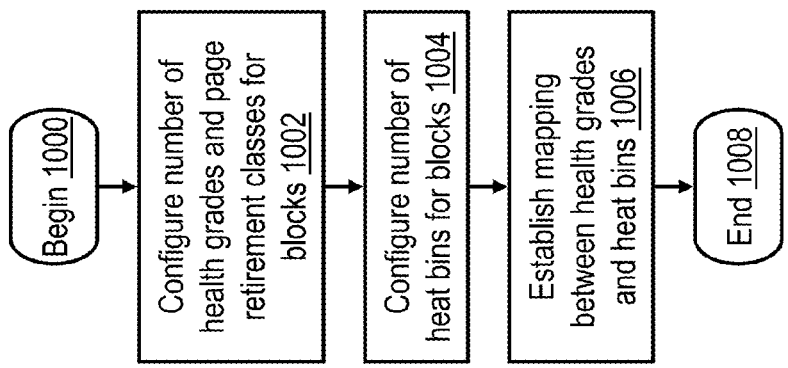
FIG. 10 is a high level logical flowchart of an exemplary process for establishing a mapping between block health grades and heat bins in accordance with one embodiment.

Referring now to FIG. 10, there is depicted a high level logical flowchart of an exemplary process by which block health grades and heat bins are configured for a NAND flash memory system in accordance with one embodiment. The method may be performed, for example, by GPP 132 or flash controller 140 in hardware or by hardware executing firmware and/or software. When performing the illustrated process or another of the processes described herein, GPP 132 and/or flash controller 140, whether performing steps individually or in concert, can thus be referred to generally as a "controller." For simplicity of explanation, it will hereafter be assumed that the process of FIG. 10 is performed by GPP 132. As with the other logical flowcharts presented herein, operations are presented in logical rather than strictly chronological order, and in some embodiments, operations can be performed in a different order than presented or concurrently.

The configuration process of FIG. 10 begins at block 1000 and then proceeds to block 1002, which illustrates GPP 132 configuring a desired number of health grades for blocks of physical memory in a NAND flash memory array 150. In at least one embodiment, the health grades are utilized to characterize the estimated remaining life of blocks of physical memory containing no retired physical pages. Even though individual blocks may change their health grade over time, the number of blocks classified with the same health grade remains approximately constant during the lifetime of the device. Therefore, the health grades classify blocks relative to each other according to their health. In various embodiments, the number of health grades can vary, but experimentally a number of health grades between one and eight inclusive has been found to be effective. For example, in one embodiment, GPP 132 configures four health grades at block 1002. The health grades employed herein may be based on one or more criteria, for example, the number of program/erase cycles to which each block is subjected, and/or one or more bit error rate (BER) metrics for each block (and/or the physical pages within each block) of physical memory, and/or the measured block erase time, and/or the measured page programming time of pages in a block. In one particular example, the BER metric used to determine block health may be the worst page BER for each block.

At block 1002, GPP 132 additionally configures a desired number of page retirement classes characterizing the health of blocks containing one or more retired physical pages. In various embodiments, the number of page retirement classes can vary, but experimentally a number of health grades between two and eight inclusive has been found to be effective. For example, in one embodiment, GPP 132 configures four health grades at block 1002.

At block 1004, GPP 132 additionally configures a desired number of heat bins 940 for LBAs served by NAND flash memory system 150. In various embodiments, the number of heat bins 940 can vary, but experimentally a number of heat bins between two and eight inclusive has been found to be effective. For example, in one embodiment, GPP 132 configures four heat bins 940 at block 1004, including a first heat bin for the least frequently written LBAs, a second heat bin for less frequently written LBAs, a third heat bin for more frequently written LBAs, and a fourth heat bin for the most frequently written LBAs. The number of heat bins 940 configured at block 1004 may, but need not, equal the number of health grades and page retirement classes configured at block 1002.

At block 1006, GPP 132 establishes a mapping between the heat bins 940 configured at block 1004 and the health grades and page retirement classes configured at block 1002. In one particularly preferred embodiment, heat and health are directly correlated, with the hottest LBAs mapped to the healthiest health grades and the colder LBAs mapped to the less healthy page retirement classes. Of course, in other embodiments, other mappings between access heat and health grades may be employed. Such alternative mappings can include those used by the build block stripes function 920 when creating a block stripe in case no free block is available for the preferred health grade. Following block 1006, the configuration process given in FIG. 10 ends at block 1008.

It should be appreciated from the process of FIG. 10 that an equal distribution of blocks to the health grades and page retirement classes can be, but need not be employed. For example, assuming four health grades denominated health grade 0 through health grade 3, is permissible to allocate the healthiest 20% of blocks having no retired pages to the healthiest health grade (e.g., health grade 0), the least healthy 20% of blocks having no retired pages to the least healthy health grade (e.g., health grade 3), and 30% of blocks having no retired pages to each of the remaining two health grades. A nonequal distribution of blocks can similarly be used between the various page retirement classes.

Figure 11:
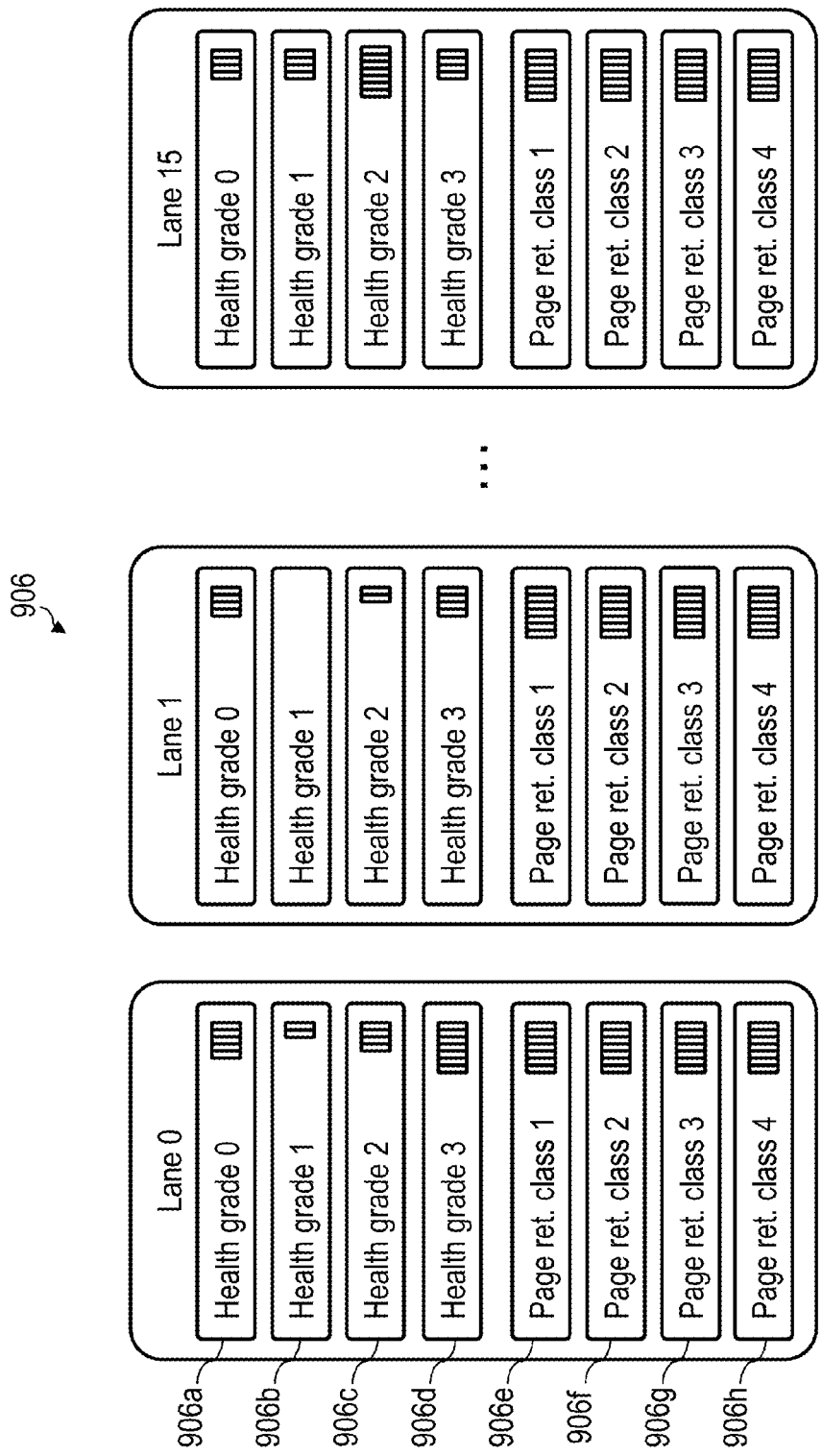
FIG. 11 depicts a more detailed view of the ready-to-use (RTU) queues of FIG. 9 in accordance with one embodiment.

Referring now to FIG. 11, there is depicted a more detailed view of ready-to-use (RTU) queues 906 in accordance with one embodiment. In the illustrated embodiment, RTU queues 906 include, for each lane, a respective RTU queue 906 for each of a plurality of block health grades and for each of a plurality of page retirement classes configured in accordance with FIG. 10. An identifier of a block that is erased and ready-to-use is enqueued in only one of the RTU queues 906 for its lane.

In the depicted embodiment, GPP 132 has configured four block health grades, for example, by applying various different thresholds to block health metrics 942, where grade 0 is assigned to the healthiest blocks (e.g., those having the lowest worst page BER), grades 1 and 2 are assigned to blocks of intermediate health, and grade 3 is assigned to the least healthy blocks (e.g., those having the highest worst page BER). GPP 132 accordingly implements four RTU queues 906a-906d per lane respectively corresponding to these four health grades. In this example, RTU queues 906a-906d are utilized to track only those erased ready-to-use blocks that have not yet had any of their constituent physical pages retired.

In the depicted embodiment, GPP 132 has additionally defined four page retirement classes and accordingly implements RTU queues 906e-906h per lane, which respectively correspond to each of these four page retirement classes. It should be appreciated that although FIG. 10 depicts one example in which four health grades and four page retirement classes are defined, in other embodiments a greater or fewer number of health grades and/or page retirement classes can be defined, and the number of health grades and page retirement classes need not be equal.

In a first embodiment referred to herein as employing a "nested class structure," page retirement class 1 includes those blocks having the fewest number of retired pages, page retirement class 2 has a greater number of retired pages, page retirement class 3 has a still greater number of retired pages, and page retirement class 4 includes those blocks having the greatest number of retired pages. In addition, the specific subset of retired pages in each higher numbered page retirement class is a superset of the retired pages in the next lower numbered page retirement class.

Figure 12:
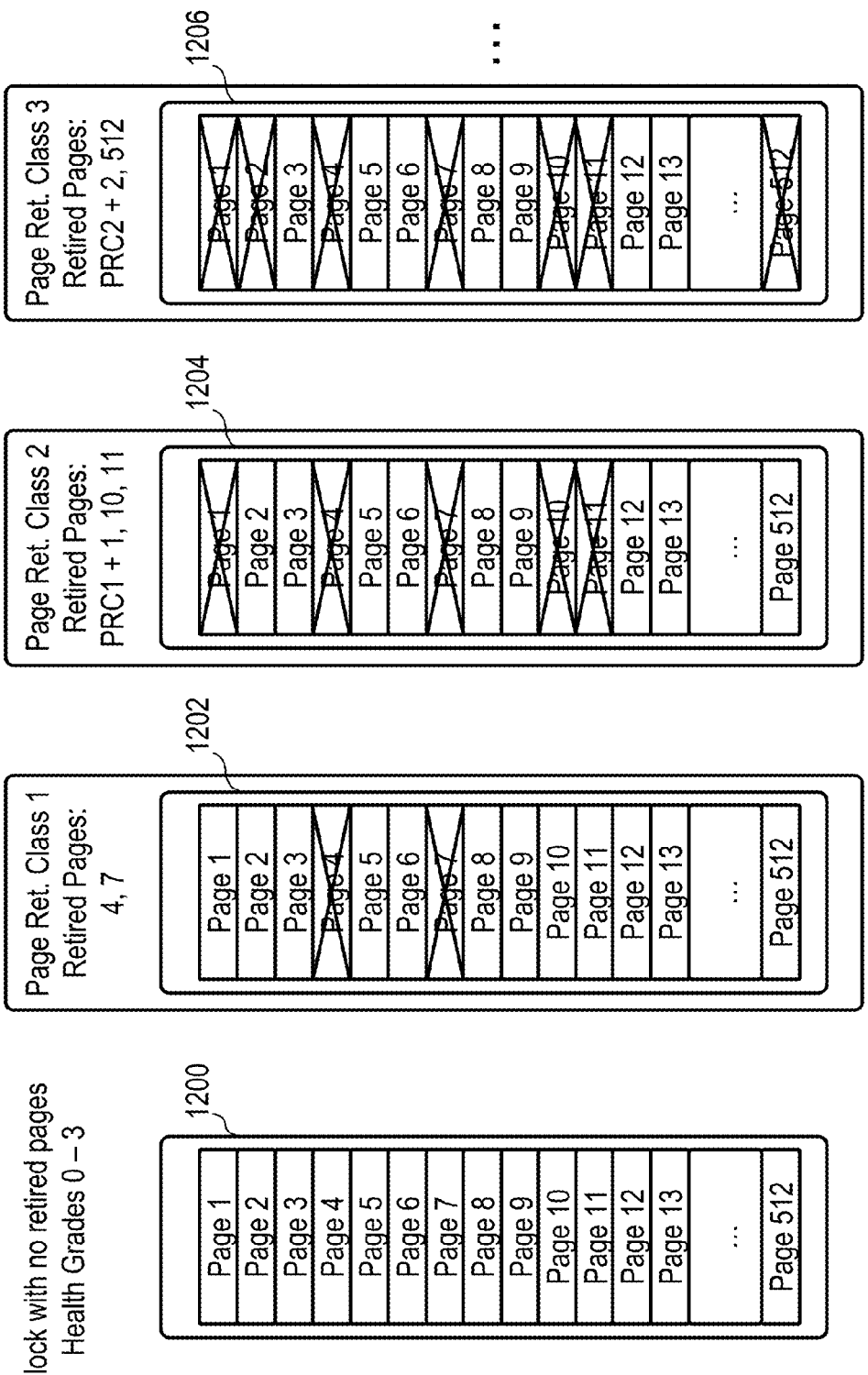
FIG. 12 illustrates exemplary nested page retirement classes in accordance with one embodiment.

This nested class structure can be understood by reference to FIG. 12, which illustrates four exemplary active (non-retired) blocks 1200-1206 at various stages of page retirement. In the example given in FIG. 12, all pages of block 1200 are active, and block 1200 accordingly can be assigned one of health grades 0-3 (e.g., based on its worst page BER and/or other block health metric 942), but is not a member of any of the page retirement classes. Block 1202, based on it having only pages 4 and 7 retired, is classified as a member of page retirement class 1. Block 1204 is classified as page retirement class 2 based on having the same retired pages as those blocks belonging to page retirement class 1 (i.e., pages 4 and 7), as well as additional retired pages 1, 10-11. Block 1206 is similarly classified as page retirement class 3 based on having the same retired pages as those blocks belonging to page retirement class 2 (i.e., pages 1, 4, 7, 10 and 11), as well as additional retired pages 2 and 512. In this example, page retirement class 4 may be defined, for example, as including those blocks having the same retired pages as those blocks belonging to page retirement class 3, as well as additional retired pages 197, 250 and 500-501.

It should be appreciated that the definition of page requirement classes in this manner reduces the amount of metadata required to track the retirement of pages within blocks. For example, instead of requiring one bit of metadata per page (e.g., 512 bits per block) to track page retirement status for a block, page retirement status only requires 2 bits per block if four page retirement classes are implemented, 3 bits per block if eight retirement classes are implemented, and so on. Further storage savings can be achieved by using the same per-block field (e.g., an 8-bit field) to track both health grades and page retirement classes and by using one bit of the field to indicate whether the remaining bits of the field indicate a health grade or a page retirement class.

Figure 13:
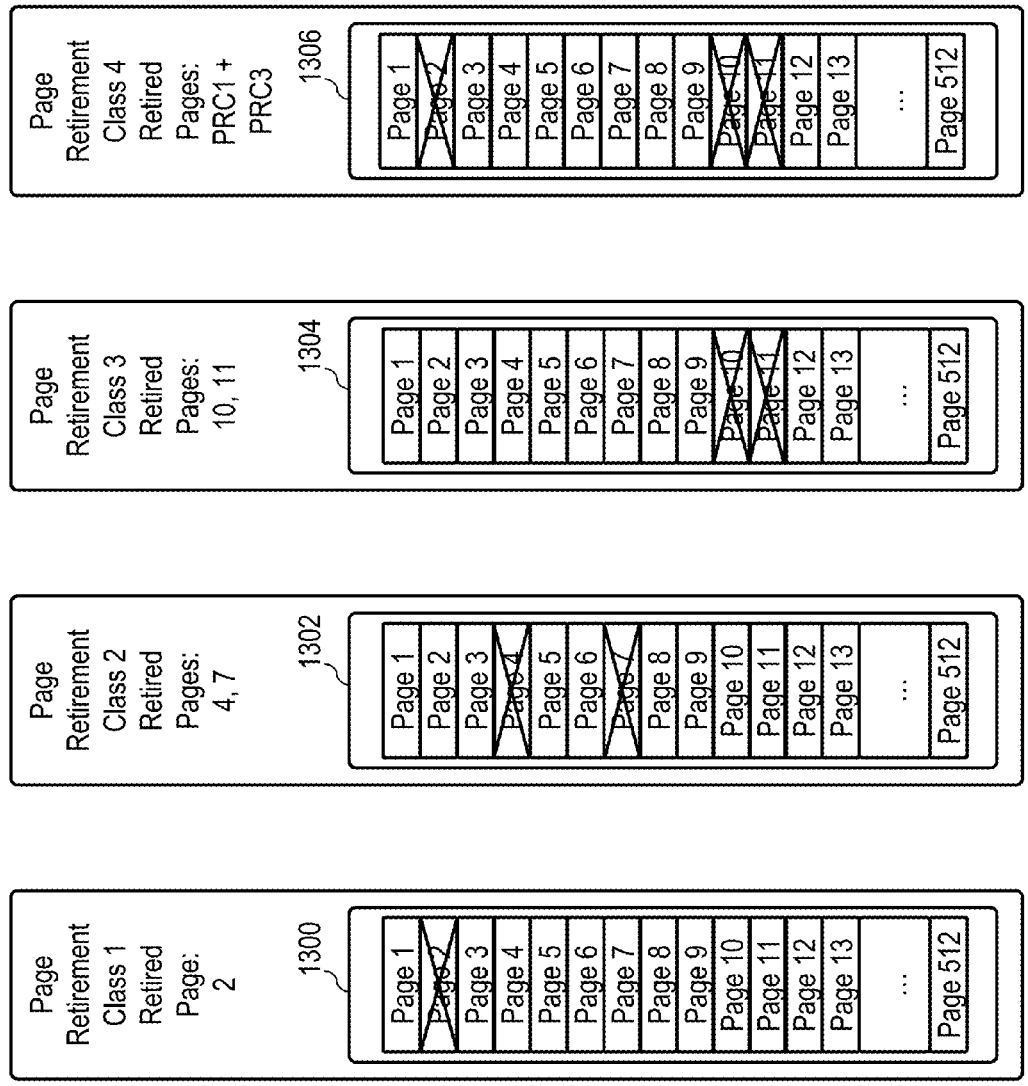
FIG. 13 illustrates exemplary pattern-based page retirement classes in accordance with another embodiment.

In a second embodiment referred to herein as employing a "pattern-based class structure," page retirement classes are again defined by the subsets of pages that are retired in the blocks that are members of the various page retirement classes, but the subsets need not be (but can be) structured as supersets of those of other page retirement classes. The pattern-based class structure can be clearly seen by additional reference to FIG. 13, which illustrates four blocks 1300-1306 at various stages of page retirement. In this example, page retirement class 1 is defined as including those blocks, like block 1300, in which only page 2 is retired. Page retirement class 2 is defined as including those blocks, like block 1302, in which only pages 4 and 7 are retired. Page retirement class 3 is defined as including those blocks, like block 1304, in which only pages 10-11 are retired. Finally, page retirement class 4 is defined as including as members those blocks, like block 1306, in which the pages corresponding to both of page retirement classes 1 and 3 are retired. Of course, in other embodiments, a greater or fewer number of page retirement classes may be defined. Further, in at least one embodiment, a catch-all page retirement class may be defined that includes all blocks having page retirement patterns that differ from the set of defined page retirement classes. For such a catch-all page retirement class, the page retirement class can be dynamically defined, for example, by all the page indices that have exhibited uncorrectable errors so far, or in other examples, all upper pages or all lower pages, etc. It should be noted that such an embodiment may also entail tracking of the individual retired pages per block (e.g., 64 bytes per block of additional page retirement metadata) since a catch-all page retirement class (unlike the other page retirement classes) does not inherently provide page retirement information. As in the first embodiment discussed above, each of the page retirement classes preferably has a respective corresponding RTU queue 906e-906h implemented per lane in RTU queues 906. In general, the pattern-based class structure shown in FIG. 13 is preferable to the nested class structure illustrated in FIG. 12 for memories in which a relatively large number of patterns or orderings of page retirement are observed.

With reference now to FIG. 14, there is illustrated a high level logical flowchart of an exemplary process for defining page retirement classes and statically configuring the RTU queues of a flash memory in accordance with the page retirement classes in one embodiment. The process begins at block 1400 and then proceeds to block 1402, which illustrates performing a large scale characterization of a particular manufacturer's flash memory module. The large scale characterization of the flash memory module generally includes, among other things, performing a series of reads, writes, and erases to various blocks and pages of the flash memory module in a timed manner as known to those skilled in the art and detecting, for example, utilizing one page retirement counter per page index, the page indices that have the highest page retirement counts (e.g., indices of physical pages that can no longer be used due to uncorrectable errors). The characterization may additionally detect the relative timing of page retirement for various page indices.

At block 1404, a set of static page retirement classes are defined based on the characterization data, and in particular, based on the page retirement timing and/or page retirement counts for the flash memory module. The type of retirement class structure that is implemented can be selected based on the observed page retirements. For example, if page retirement generally follows a single common pattern across all blocks such that particular pages at particular page indices are generally retired first and then pages at additional page indices are retired, a nested class structure as shown in FIG. 12 can be selected. If, on the other hand, a number of different page retirement patterns are observed across the blocks comprising the flash memory module and/or the relative timing of page retirement between page indices varies, a pattern-based class structure as depicted in FIG. 13 can be selected.

Block 1406 additional illustrates the definition of the page retirement classes based on the characterization data. At block 1406, a number of page retirement classes is selected, and each such page retirement class is defined by associating a particular subset of page indices with each retirement class number. As shown in FIG. 12, for a nested class structure, the earliest retired and/or most frequently retired page indices can be associated with the lowest numbered page retirement classes and the later retired and/or less frequently retired page indices can be associated with higher numbered page indices. The goal of the construction of the page retirement classes is that the pages defining a given page retirement class all have the same or higher probability of retirement (e.g., in FIG. 12, the probability of retirement of pages 4 and 7 of page retirement class 1 is approximately the same and the probability of retirement of pages 1, 10 and 11 of page retirement class 2 is approximately the same). As shown in FIG. 13, for a pattern-based class structure, the pattern having the highest page retirement counts can be associated with the highest numbered page retirement classes and the patterns having lower page retirement counts can be associated with lower numbered page retirement classes.

At block 1408, the GPPs 132 or flash controllers 140 of the flash cards 126 forming a commercial data storage system 120 prepare the data storage system 120 for use by configuring RTU queues 906 in accordance with the configured number of health grades and page retirement classes, the selected page retirement class structure, and the page retirement class definitions. Thereafter, the process of FIG. 14 ends at block 1410.

Referring now to FIG. 15, there is depicted a high level logical flowchart of an exemplary process for dynamically selecting a page retirement class structure and building dynamic page retirement classes in accordance with one embodiment. The process of FIG. 15 can optionally be implemented, for example, by the GPP 132 of a flash card 126 during operation of a data storage system 120. The process may be performed, for example, following initialization of the page retirement classes in accordance with the process given in FIG. 14.

The process of FIG. 15 begins at block 1500 and then proceeds to block 1502, which illustrates GPP 132 determining whether a new uncorrectable error has been detected in one or more physical pages that have not yet been retired. If not, the process waits until a new uncorrectable error is detected, as illustrated by the process returning to block 1502. If, however, one or more uncorrectable errors are detected in a physical page of memory, the process proceeds from block 1502 to block 1504. In the depicted embodiment, at block 1504 GPP 132 and/or a flash controller 150 determine the appropriate page retirement class of the block and if needed (i.e., if the page retirement class has changed) update the page retirement class in the BST 946 of the block. The process then proceeds to block 1506, which illustrates GPP 132 and/or flash controller 150 updating the page retirement statistics (PRS) 948, which, for example, maintain for each page index a separate counter recording the number of retired pages for the given page index. These counters may be maintained globally for all blocks in the flash card 126, per lane, per plane, or according to any other possible grouping of blocks. PRS 948 may further include additional counters for page retirement classes or any other statistics such as correlations between retired pages that can be used to dynamically update page retirement classes later on. If present, these additional counters in PRS 948 are also updated in block 1506. Hence, updating PRS 948 preferably includes incrementing all necessary counter values in PRS 948 that are associated with the addition of the newly retired page(s).

The process then continues with optional blocks 1508 or 1510, or directly proceeds to block 1512 in case both optional steps 1508 and 1510 are skipped. In case optional block 1508 is skipped and the process continues with optional block 1510, both pattern-based and nested page retirement groups are dynamic and may be updated. Correspondingly, if optional block 1508 is skipped and process continues with block 1512 both pattern-based and nested page retirement groups are static and need not be updated.

Referring now to block 1508, GPP 132 optionally determines whether pattern-based page retirement classes are currently being implemented. In one embodiment, if a nested class structure is implemented, the retirement class definitions are static and are therefore not dynamically updated during operation of data storage system 120. In this embodiment, in response to a determination that pattern-based page retirement classes are not currently being implemented, the process continues with block 1512, which will be described below. In response, however, to a determination at block 1508 that pattern-based page retirement classes are currently being implemented (or following processing block 1506 in cases in which block 1508 is omitted), the process proceeds to blocks 1510-1514, which illustrate GPP 132 potentially dynamically updating the definitions of the page retirement classes in block 1510 as an optional step based, for example, on the count values of page retirement statistics (PRS) 948 (see, e.g., FIG. 9) maintained by GPP 132 and/or flash controllers 150 for each page index, or directly detecting if available memory capacity is used efficiently in case updating the dynamic page retirement classes (block 1510) is skipped. Note that in yet another embodiment block 1508 could alternatively determine whether nested page retirement classes are currently being implemented (not shown in FIG. 15). For example, in one embodiment, GPP 132 may dynamically update the page retirement classes if greater than a threshold number of page indices represented in the previously implemented set of page retirement classes are no longer represented in the N highest count values, where N is a current number of page retirement classes. Following block 1510, the process continues with block 1512.

In the depicted embodiment, at block 1512 GPP 132 and/or a flash controller 150 determines whether or not the currently implemented page retirement class structure is causing the available memory capacity of the flash card 126 to be used efficiently. For example, GPP 132 may implement a background observation mechanism that periodically determines the efficiency of use of the memory capacity of NAND flash memory systems 150 based on one or more metrics, for example, the percentage of block stripes built from blocks having no retired pages, the percentage of block stripes built exclusively from blocks of a single page retirement class, the number of retired good pages of a single page retirement class, and/or the amount of metadata being stored per block to track page retirement. As an example of early retirement of a good page of a block, consider the case in which only page 7 of a block exhibits an uncorrectable error rate. If the page retirement classes from FIG. 13 are employed, this block can be classed as belonging to page retirement class 2, which in addition to page 7 also retires page 4, which for the subject block still happens to be a good page. In response to a determination at block 1512 that the currently implemented retirement class structure is causing the available memory capacity of the flash card 126 to be used efficiently, the process proceeds from block 1512 to block 1502, which has been described above. However, in response to a determination at block 1512 that the currently implemented page retirement class structure is not causing the available memory capacity of flash card 126 to be used efficiently, GPP 132 may change the page retirement class structure at block 1514, for example, by switching from a nested class structure to a pattern-based class structure or vice versa. Thereafter, the process returns to block 1502.

Figure 16:
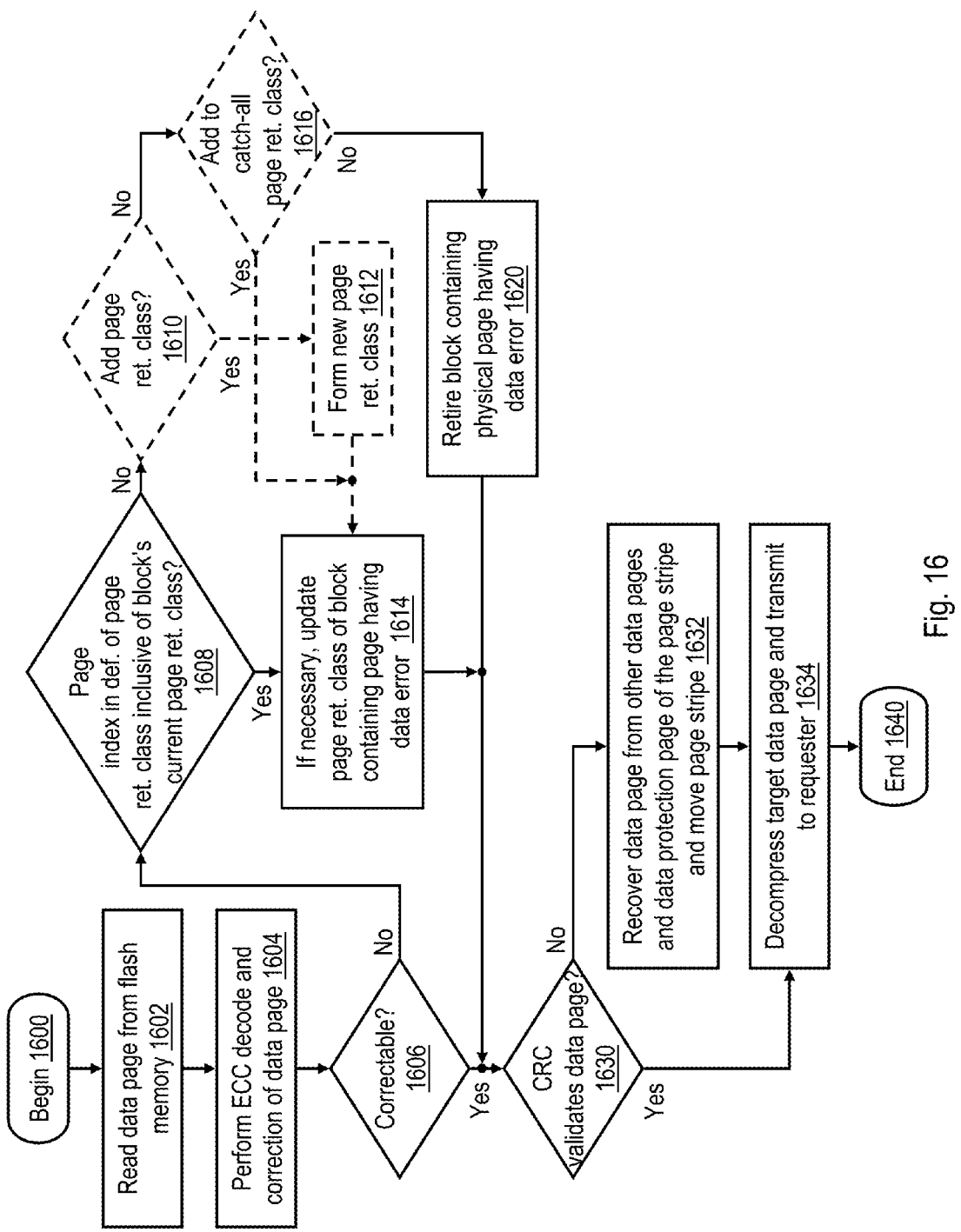
FIG. 16 is a high level logical flowchart of an exemplary process for retirement of subsets of blocks of physical memory in accordance with one embodiment.

With reference now to FIG. 16, there is illustrated a high level logical flowchart of an exemplary process for sub-block retirement of physical memory in accordance with one embodiment. The illustrated process can be performed by a flash controller 140 and/or GPP 132, for example, during a demand read operation performed in response to a host system's read IOP or during a background read performed by background health checker 930. The method may be implemented, for example, in hardware and/or by hardware executing firmware and/or software.

The illustrated process begins at block 1600 and then proceeds to block 1602, which depicts flash controller 140 reading a requested data page from a flash memory module by issuing a read request to read the target data page from the target physical page associated with a target physical address (e.g., one associated in LPT table 900 with a logical address of a read IOP or one specified by background health checker 930). The read request may request various sizes of data, but for simplification it is assumed that the flowchart given in FIG. 16 will be exercised once for each logical page read from a NAND flash memory system 150.

At block 1604, flash controller 140 performs ECC decoding for the data page to attempt to correct any bit errors in the data page. In the depicted embodiment, if the bit errors, if any, in the data page are correctable, the ECC decoder within flash controller 140 corrects the bit errors and returns the number of such bit errors and a correctable status. For example, the ECC decoder will determine that bit errors are correctable if there are 50 bits in error within the codeword and the ECC is capable of correcting greater than 50 bits in error within the codeword. If, on the other hand, the bit errors in the data page are uncorrectable, the ECC decoder returns an uncorrectable status. It will be appreciated that bit errors in the data page can be caused by a variety of factors including, but not limited to, the physical failure of one or more components within a given memory chip (such as the failure of a charge pump), the physical failure of an entire memory chip or the external support structures for that chip (e.g., the breaking of a power line or an address line to a chip), the physical failure of all or part of a chip as a result of environmental factors (e.g., excessive temperature, magnetic field, humidity, etc), trapped charge in the oxide layer of the physical device, leakage of charge from the floating gate (or similar charge trap device) of a memory cell, and/or electrical noise inflicted by writes or reads of adjacent memory cells. It should also be noted that physical regions within a NAND flash memory system can and do exhibit dramatic variations in the probability of bit errors. For example, at a particular point in the lifetime of a NAND flash memory device, the probability of having a bit error occurring in page 5 of a block of a particular flash memory product could be 1%, while the probability of a bit error occurring in page 10 of the same block could be 0.001%. Similar variability in the probability of bit errors can also be observed between modules, dies, planes, and blocks of the same flash memory product.

At block 1606, flash controller 140 determines whether or not the ECC decoder returned a correctable status for the data page. If so, in one embodiment, the process passes directly to block 1630, which is described below. However, in response to a determination at block 1610 that the ECC decoder did not return a correctable status for the data page (i.e., the ECC decoder returned an uncorrectable status for the data page), the process proceeds to block 1608 and following blocks, which together illustrate the imprecise retirement of a subset of the target block of physical memory, and in particular, the retirement of one or more physical pages of the block specified by a page retirement class. In addition the process may trigger a recovery process that utilizes higher-level redundancy (e.g., parity information in the block stripe 600 or on the RAID controller 124 level from a different flash card) to reconstruct lost data (not shown in FIG. 16).

At block 1608, flash controller 140 determines whether or not the page index of the target physical page in which the uncorrectable error occurred is utilized to define a currently defined page retirement class inclusive of the current page retirement class of the target block containing the physical page in which uncorrectable error occurred. If so, flash controller 140 updates in BST 946 the page retirement class of the target block containing the physical page in which the uncorrectable error occurred, if necessary (block 1614). The update, if needed, updates the page retirement class of the target block to the healthiest (e.g., lowest numbered) page retirement class whose definition is inclusive of both the current page retirement class of the target block and the physical page in which uncorrectable error occurred. Note that the updated page retirement class may also retire additional pages in the block which currently are still good pages when page retirement classes are defined to include more than one retired page.

For example, assuming page retirement classes are implemented with the nested page retirement classes illustrated in FIG. 12, flash controller 140 updates the block status of the target block from representing membership in no page retirement class (e.g., one of health grades 0-3) to page retirement class 1 in response to occurrence of an uncorrectable error in physical page 4. If an uncorrectable error is subsequently detected in physical page 7 while the physical page is in page retirement class 1, no update to the block status of the target block is necessary at block 1614. If, however, an uncorrectable error is subsequently detected in physical page 2 while the physical page is in page retirement class 1, the block status of the target block is directly updated to page retirement class 3 without first being updated to page retirement class 2.

As another example, assuming implementation of the pattern-based page retirement classes depicted in FIG. 13, flash controller 140 updates the block status of the target block from representing membership in no page retirement class (e.g., one of health grades 0-3) to page retirement class 1 in response to occurrence of an uncorrectable error in physical page 2. If an uncorrectable error is subsequently detected in physical page 10, the block status is directly updated to page retirement class 4 (rather than page retirement class 3, which does not include page index 2 in its definition). It should be appreciated that by tracking the retirement of physical pages of blocks imprecisely (i.e., over-inclusively), significant savings in metadata storage can be achieved with a tradeoff in device endurance (as physical pages and blocks will tend to be retired in advance of need). Following block 1614, the process proceeds to block 1630, which is described below.

Returning to block 1608, in response to a determination that the page index of the physical page in which the uncorrectable error occurred is not included in the definition of any page retirement class inclusive of the target block's current page retirement class, the process proceeds either directly to block 1620 in the case that static page retirement classes are implemented, or, in the case that dynamic page retirement classes are implemented, first proceeds to block 1610. Block 1610 illustrates flash controller 140 or GPP 132 determining whether or not to add to the set of defined page retirement classes a new page retirement class whose definition is inclusive of both the target block's current page retirement class and the target physical page. The determination illustrated at block 1610 may be made based on, for example, the number of presently defined page retirement classes and health grades, the maximum of amount of block status metadata to be maintained per block, the page retirement statistics PRS 948 (if implemented), and/or the type of page retirement class structure currently implemented. In response to a determination at block 1610 that a new page retirement class is to be defined, flash controller 140 or GPP 132 establishes a new page retirement class having a definition inclusive of both the current page retirement class of the target block and the target physical page (block 1612). For example, assuming the pattern-based page retirement class structure depicted in FIG. 12, if only page retirement classes 1-3 are currently defined and an error occurs in physical page 10 of the target block while the target block is in page retirement class 1, GPP 132 may dynamically define page retirement class 4 at block 1612. From block 1612, the process passes to block 1614, which illustrates flash controller 140 or GPP 132 updating the page retirement class of the target block to the page retirement classes newly formed at block 1612. Thereafter, the process passes to block 1630, which is described below.

If block 1610 is not implemented or in response to a negative determination at block 1610, flash controller 140 or GPP 132 may optionally further determine at block 1616 whether or not to add the target block to a catch-all page retirement class. If so, the process passes from block 1616 to block 1614, where the page retirement class of the target block is updated to the catch-all page retirement class (and the page retirement information is also updated to indicate which specific physical page(s) of the target block are retired). In response to a negative determination at block 1616 or if block 1616 is omitted, flash controller 140 or GPP 132 retires the entire target block containing the target physical page (block 1620). The process then passes to block 1630.

Thus, in at least some embodiments, data storage system 120 retires physical memory in NAND flash memory system 160 on a page retirement class basis (rather than on a block-by-block basis). As will be appreciated, retirement of memory on the basis of page retirement classes (e.g., defined by one or more 16 kB physical pages of memory) rather than on a block basis (e.g., 4 MB of memory) conserves physical memory resources, enhancing the performance and extending the life of NAND flash memory system 160. Retirement of physical memory by page retirement classes rather than solely by individual physical pages can also be employed to reduce the attendant metadata, as described above. However, as a consequence of physical memory on a sub-block basis, the effective sizes of blocks of physical memory of NAND flash memory system 140 will vary, as described further below.

Referring now to block 1630, flash controller 140 attempts to validate the one or more data fields 702 and LBA fields 704 of the target data page by computing a cyclic redundancy code for each codeword 700 or data protection codeword 800 and comparing the computed CRC to that contained in CRC field 706. In response to successful validation of the data page, the process proceeds to block 1634, which is described below. However, in response to failure of the CRC validation, flash controller 140 reads the entire page stripe and recovers the correct content of the target data page from the other data page(s) and the data protection page of the page stripe (block 1632). In addition, flash controller 140 relocates the page stripe (including the recovered target data page) to a different physical location in NAND flash memory system 120, for example, utilizing relocation function 914. From block 1630 or block 1632, the process proceeds to block 1634, which illustrates flash controller 140 decompressing the target data page (if necessary) and transmitting the decompressed target data page to the requester. Thereafter, the process of FIG. 16 terminates at block 1640.

The exemplary implementation shown in FIG. 16 waits until a physical page has one or more codewords containing uncorrectable errors before initiating retirement of one or more physical pages. However, certain implementations may choose to initiate retirement at some point prior to uncorrectability. For example, in one embodiment, flash controller 140 further determines at block 1606 whether the number of corrected bit errors satisfies (e.g., is less than) a bit error threshold lower than the ECC correction threshold. For example, if an implementation uses BCH ECC over approximately 1024 bytes and can correct 50 bits in error, flash controller 140 may decide to retire a page when the number of corrected bit errors reaches a number less than 50, say 48. In such implementations, the process passes from block 1606 to block 1608 in response to a determination that the bit error threshold is exceeded. Additionally, one skilled in the art will also know that, depending on the flash technology used, that flash controller 140 may elect to perform additional steps at block 1606 before determining that the page is truly uncorrectable and retirement should be invoked. For example, the flash manufacturer may require flash controller 140 to change certain parameters for that page or block and perform a re-read of the page. If the bit errors, if any, detected upon the re-read are correctable, then flash controller 140 would follow the "Yes" path from block 1606 to block 1630. In this way, block 1606 may contain many additional steps that, although not illustrated in detail, are performed in determining that the page contains a truly uncorrectable error.

Figure 17:
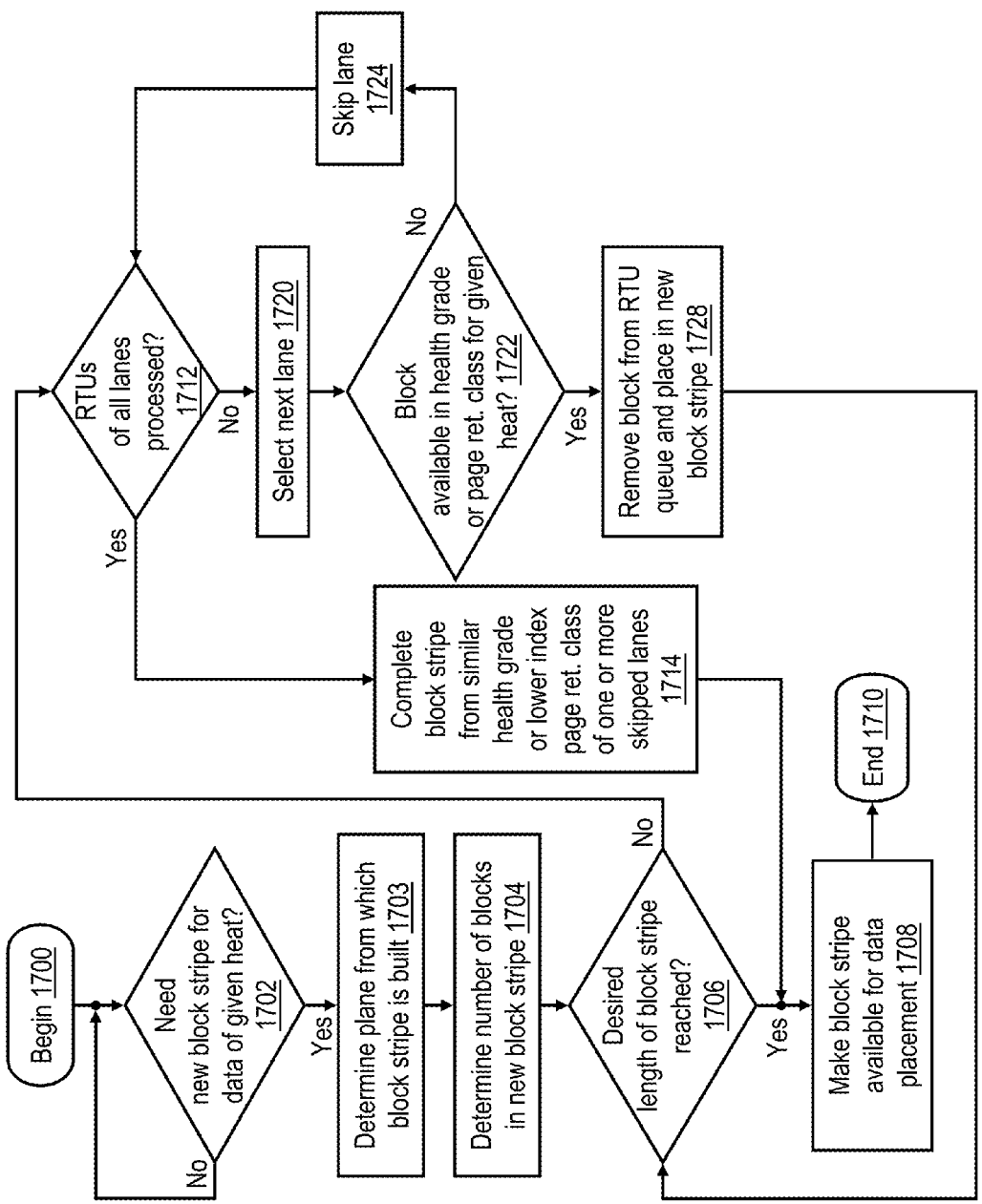
FIG. 17 is a high level logical flowchart of an exemplary process for building a block stripe in accordance with one embodiment in which nested page retirement classes are implemented.

Referring now to FIG. 17, there is depicted a high level logical flowchart of an exemplary process for building a block stripe in accordance with one embodiment in which a nested page retirement class structure is employed. The illustrated process may be implemented, for example, by the build block stripes function 920 and/or data placement function 910 performed by GPP 132 or flash controller 140 in hardware or in hardware executing firmware and/or software.

The process of FIG. 17 begins at block 1700 and then proceeds to block 1702, which illustrates build block stripes function 920 determining whether or not a new block stripe is needed for a given heat of data. In at least some embodiments, build block stripes function 920 determines whether a new block stripe is needed based on demand for new block stripes generated by write IOPs and/or the number of currently available unused block stripes for each of a plurality of different heat bins. In response to a determination at block 1702 that there is presently no need to build a new block stripe for a given heat bin, the process iterates at block 1702. However, in response to build block stripes function 920 determining that a new block stripe is needed for holding write data for a particular heat bin, the process passes to block 1703. At block 1703 the process decides from which plane the build block stripe function 920 will assemble a block stripe. In at least some embodiments, this decision may be made based on a round robin selection from among all planes. The process then passes to block 1704.

At block 1704, build block stripes function 920 preferably determines a desired number of blocks within a new block stripe to be built. For example, in some embodiments, build block stripes function 920 is configured to build and queue for use block stripes of a variety of differing lengths in order to efficiently store page stripes of varying lengths. At block 1706, build block stripes function 920 enters a processing loop in which build block stripes function 920 determines whether enough blocks have been assigned to the block stripe under construction to reach the desired length determined at block 1704. If so, the process passes to block 1708, which is described below. If not, the process proceeds to block 1712, which illustrates build block stripes function 920 determining whether or not the RTU queues 906 of all lanes of NAND flash memory system 170 have been processed. If so, the process passes to block 1714, which is described below. If, however, build block stripes function 920 determines at block 1712 that the RTU queues 906 of all lanes have not been processed, the process proceeds to block 1720.

Block 1720 depicts build block stripes function 920 selecting a next lane for which RTU queues 906 are to be processed. In various embodiments, various selection techniques, such as round robin, random, least recently used, etc. can be utilized to select the next lane. Next, at block 1722, build block stripes function 920 determines at block 1722 whether or not a block is available in the RTU queue 906 of the selected lane to which the given heat bin is mapped. In response to a determination at block 1722 that a block is not available in the relevant RTU queue 906, build block stripes function 920 skips the lane when forming the new block stripe (block 1724), meaning that the RTU queue 906 for the given heat and the selected lane does not contribute a block to the new block stripe. It should be noted, however, that in some embodiments the number of lanes that can be skipped when building a given block stripe can be limited. Following block 1724, the process then returns to block 1712, which has been described.

Referring again to block 1722, in response to determining that a block is available on the relevant RTU queue 906, the process passes to block 1728. Block 1728 illustrates build block stripes function 920 dequeuing a block from the RTU queues 906 for the given heat and selected lane and placing the block within the new block stripe. The process then returns to block 1706.

As the process iterates through the loop illustrated at block 1706, blocks are added to the block stripe until the desired block stripe length is reached (block 1706) or the RTU queues 906 of all lanes for the given heat are processed (block 1712). In response to a determination at block 1712 that the RTU queues 906 for the given heat in all lanes have been processed without reaching the desired length of the block stripe, build block stripes function 920 completes the block stripe using blocks from the RTU queues 906 of one or more lanes that were initially skipped (block 1714). As one example, build block stripes function 920 may include, from a previously skipped lane, a block from an RTU queue 906 associated with a similar (higher or lower) health grade than the preferred health grade to which the given heat maps. It may also include a block from one of the page retirement classes. This may be, for example, a case when no block with similar health grade is available. Following block 1714 or in response to a determination at block 1706 that the desired length of the block stripe has been reached, build block stripes function 920 makes the new block stripe available for data placement, as shown at block 1708, for example, by adding the new block stripe to an unillustrated queue. Thereafter, the process of FIG. 17 ends at block 1710.

While the method of FIG. 17 has been specifically described with reference to an embodiment in which blocks are queued for re-use (and skipped during block stripe formation) on a lane-by-lane basis, it should be appreciated that in other embodiments, blocks can alternatively be queued for re-use (and skipped during block stripe formation) at an alternative subdivision of storage granularity, such as module, CE, die or plane, or at a combination of two or more different subdivisions.

Figure 18:
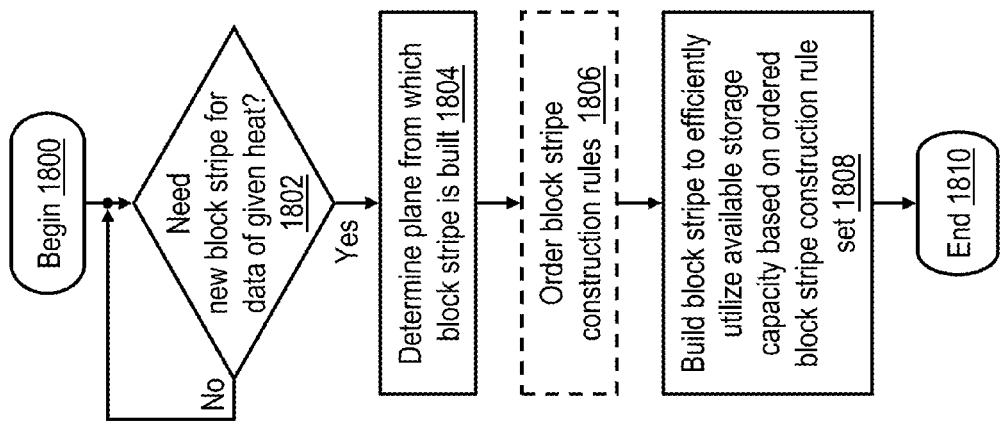
FIG. 18 is a high level logical flowchart of an exemplary process for building a block stripe in accordance with another embodiment in which pattern-based page retirement classes are implemented.

With reference now to FIG. 18, there is illustrated a high level logical flowchart of an exemplary process for building a block stripe in accordance with another embodiment in which a pattern-based page retirement class structure is employed. The illustrated process may be implemented, for example, by the build block stripes function 920 and/or data placement function 910 performed by GPP 132 or flash controller 140 in hardware or in hardware executing firmware and/or software.

The process of FIG. 18 begins at block 1800 and then proceeds to block 1802, which illustrates build block stripes function 920 determining whether or not a new block stripe is needed for a given heat of data. In at least some embodiments, build block stripes function 920 determines whether a new block stripe is needed based on demand for new block stripes generated by write IOPs and/or the number of currently available unused block stripes for each of a plurality of different heat bins. In response to a determination at block 1802 that there is presently no need to build a new block stripe for a given heat bin, the process iterates at block 1802. However, in response to build block stripes function 920 determining that a new block stripe is needed for holding write data for a particular heat bin, the process passes to block 1804. At block 1804 the process decides from which plane the build block stripe function 920 will assemble a block stripe. In at least some embodiments, this decision may be made based on a round robin selection from among all planes. The process then passes to block 1806.

Block 1806 illustrates an optional step in which GPP 132 or flash controller 140 orders a set of block stripe construction rules to determine a sequence in which the block stripe construction rules are applied. For example, in one embodiment the set of block stripe construction rules may include the following:

1. Try to build a block stripe from blocks containing no retired pages;
2. Try to build a block stripe solely from blocks in the same page retirement class such that entire page stripes are skipped during writing, limiting the capacity loss to the actual number of retired pages with no impact on write performance (see, e.g., FIG. 19 which illustrates both page stripes of active pages and skipped page stripes);
3. Try to build a block stripe from blocks with a large number (e.g., greater than a first threshold (T1)) that belong to the same page retirement class such that skipping the entire page stripe(s) only leads to a small number of active pages temporarily being unused and little or no impact on write performance;
4. Try to build a block stripe from blocks where only a small set of the blocks (e.g., less than a second threshold (T2)) belong to a particular page retirement class such that the parity overhead only marginally increases (see, e.g., FIG. 20 which depicts all blocks of the block stripe being in page retirement class 1 except for block 5 in lane 1, which belongs to page retirement class 4);

5. If no block stripe can be built according to the first through fourth rules, then build a block stripe such that a temporarily unused page stripe includes a greater number of active pages than the first threshold T1, or the variable page stripe is built with less active pages than the second threshold T2. Which of these alternatives is used may be based, for example, on the number of active pages in the page stripe, the number of active pages unused in the page stripe, the total used capacity, the observed or estimated write workload, current write amplification, etc.

The order of the rules chosen at block 1806 may depend on the health of individual blocks to be picked, the average health of the blocks in each RTU queue 906, the number of blocks in each RTU queue 906, the number of active pages wasted in total in the block stripe, the total used capacity, the observed or estimated write workload, current write amplification, etc.

In one embodiment, the first threshold T1 referenced in the foregoing rule set denotes the minimum number of retired pages in a page stripe at which the entire page stripe will be skipped when a block stripe is built. With n lanes, first threshold T1=n−i, where i denotes the maximum number of good pages in a temporarily retired page stripe. In one possible embodiment n=28, and i may be set to 1, 2, or 3, for example. In this embodiment, second threshold T2, which denotes the minimum variable page stripe length below which a page stripe will not be used to hold data, can be defined as second threshold T2=n−k, where k denotes the maximum tolerable number of retired pages in a page stripe and 0<=k<=n. For example, k may be set to 1, 2, or 3.

Following block 1806, the process passes to block 1808, which illustrates build block stripe function 920 applying the ordered rules of the block stripe construction rule set to build a block stripe. In an exemplary embodiment in which the five rules given above are employed, application of the first two rules is straight forward, in that a block stripe can be constructed in accordance with these rules by selecting blocks from the corresponding RTU queues 906 across all lanes contributing a block to the block stripe. However, in the case that one or more lanes do not have a block in the RTU queue 906 mapped to a given heat and page retirement class (the "preferred page retirement class"), a "filler" block must be contributed to the block stripe from another RTU queue 906 of that lane.

In one embodiment, these "filler" blocks can be determined by first selecting, if possible, a block from an RTU queue 906 associated with a page retirement class defined by a set of retired pages that is a superset of the set of retired pages defining the preferred page retirement class. The goal of this strategy is to build a block stripe such that each page stripe either has more than T2 or less than T1 pages retired, which allows page stripes built from the retired pages utilized to define the preferred page retirement pattern to be skipped and for variable length page stripes to be built from any other page stripes including retired pages contributed by "filler" blocks.

A second strategy would be to select a "filler" block for a lane from one of the RTU queues 906 for tracking blocks having no retired pages (e.g., RTU queues 906a-906d of FIG. 11). This second strategy can be used to complete a block stripe if all "filler" blocks necessary to complete the block stripe can't be obtained by the first strategy noted above or if taking a block from RTU queue 906 corresponding to a pattern-based page retirement class would result in one or more page stripes having more than T1 retired pages but less than T2 retired pages.

A third strategy, which would typically result in a greater number of variable page stripes, would be to select a "filler" block from an RTU queue 906 corresponding to the catch-all page retirement class. It may also be the case that some page stripes will have more than k and less than n retired pages. As a result, those page stripes will be skipped despite containing one or more active pages. In should be noted that the active pages are not retired and are only temporarily unused (i.e., for the current write iteration). As soon as the block stripe is garbage collected and the identifiers of the blocks are again recorded in the appropriate RTU queue 906, a new block stripe that utilize such pages can again be built.

Figure 19:
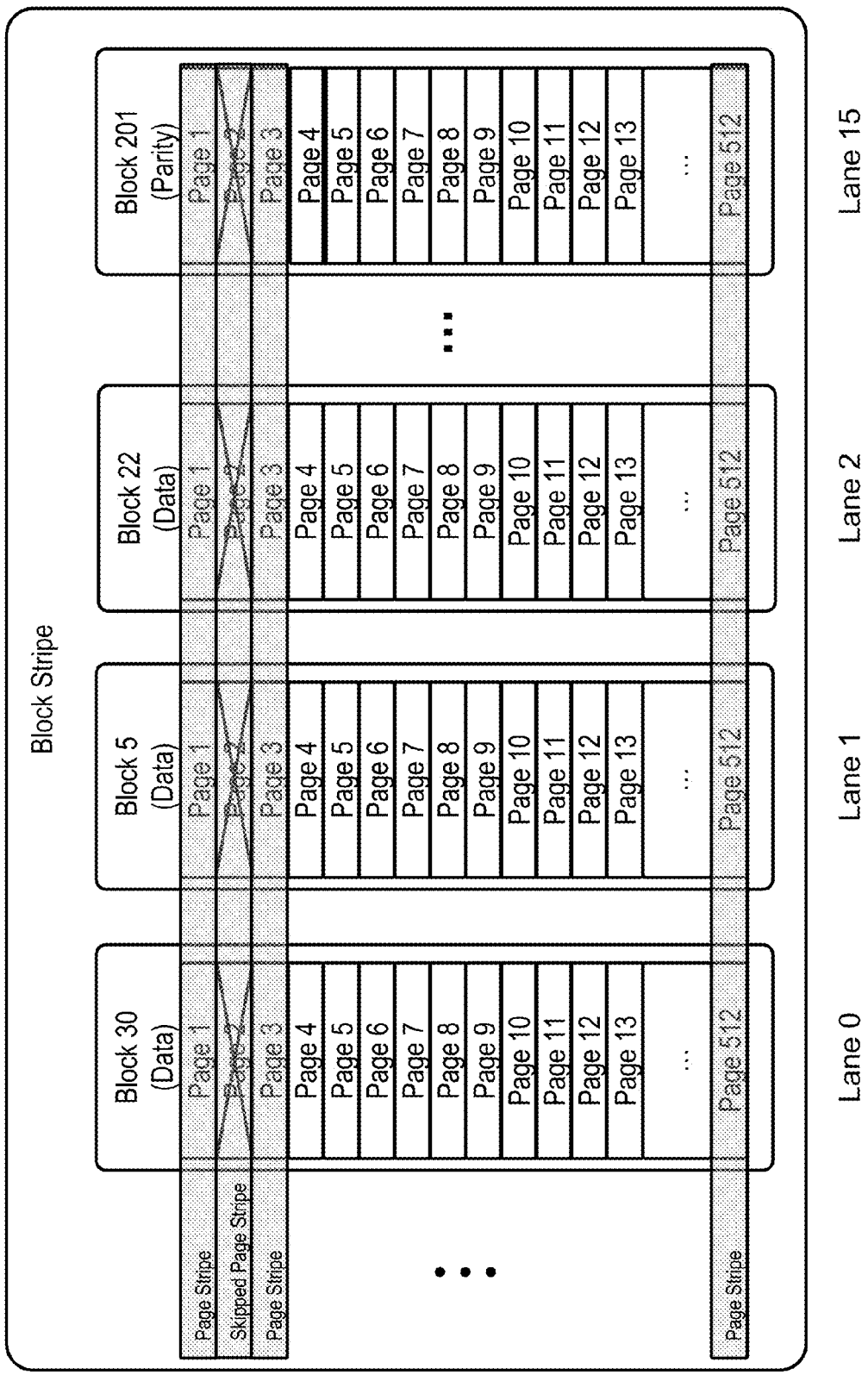
FIGS. 19-20 depict two exemplary block stripes built according to the process of FIG. 18.
Figure 20:
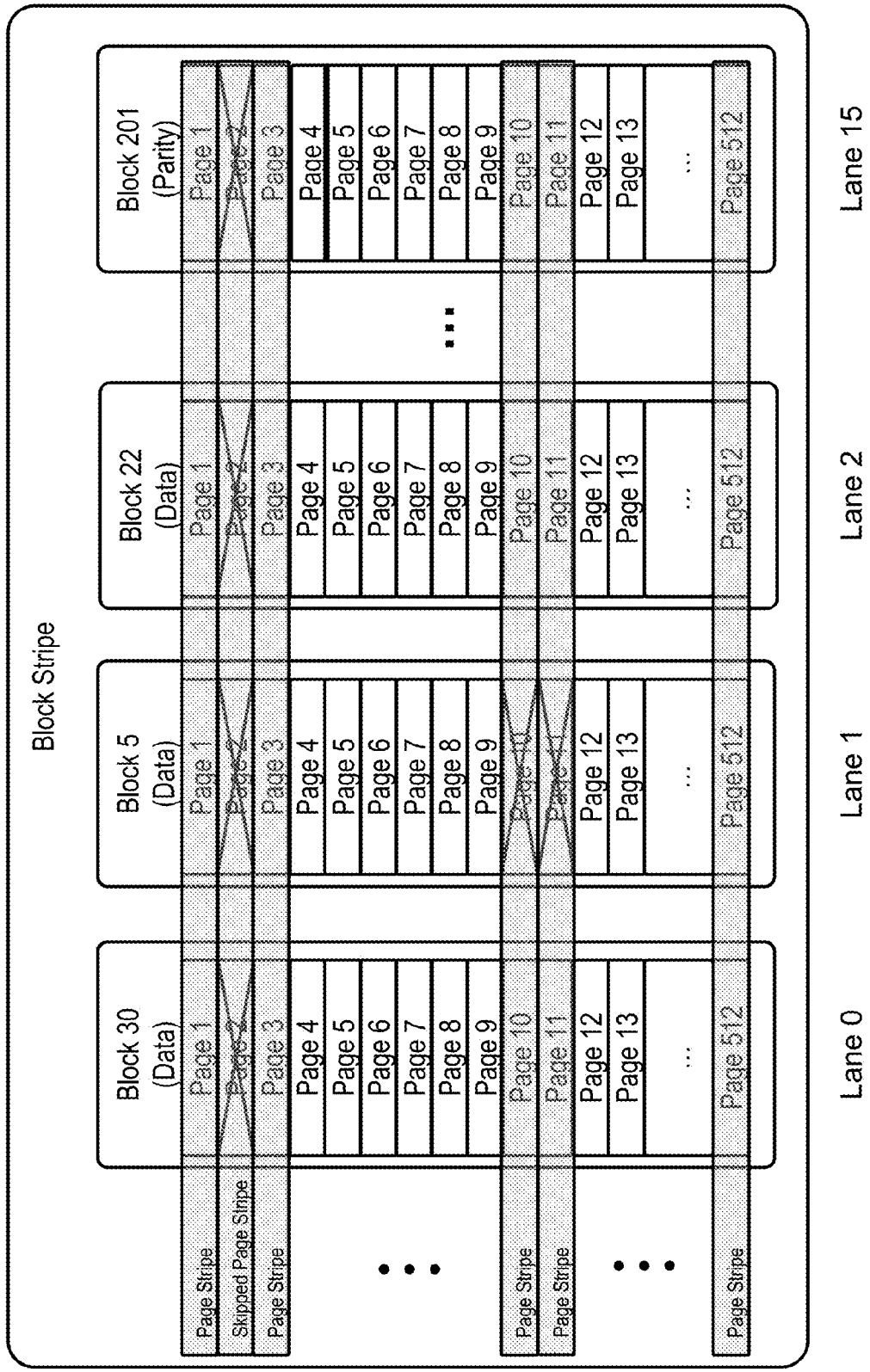

In one exemplary embodiment, build block stripe function 920 may apply the exemplary set of five rules set forth above by applying the first rule if the block stripe is to be built for storing write data of relatively hot logical addresses. If the block stripe is to be built for storing write data for relatively colder logical addresses and therefore would preferably be constructed from blocks having retired pages, block stripe function 920 may first attempt to build a block stripe according to second rule. In this case, the resulting block stripe may be as shown in FIG. 19, which illustrates an exemplary block stripe constructed from blocks drawn from RTU queues 906 corresponding to page retirement class 1 of FIG. 13.

If, in a given lane, the number of blocks with retired pages in RTU queues 906 is significantly less than the number of blocks with no retired pages in RTU queues 906, it is preferable if build block stripes function 920 does not build block stripes with blocks having retired pages (which would result in variable pages stripe(s) having less than n good pages, but greater than or equal to T2 pages), but instead waits until more blocks with retired pages are enqueued in RTU queues 906 such that the likelihood is increased that a block stripe can be built according to the second rule.

If, in a given lane, the number of blocks with retired pages is significantly greater than those with no retired pages, build block stripes function 920 determines if a block stripe can be built according to the third rule or fourth rule. If both the third and fourth rules enable a block stripe to be built, the rule that maximizes storage efficiency is utilized to build the block stripe. However, if neither the third rule nor the fourth rule enables a block stripe to be built, then build block stripes function 920 preferably tries to build the block stripe according to the first rule, and failing that, the fifth rule.

If, in a given lane, the number of blocks with retired pages is substantially similar to the number of blocks having no retired pages, build block stripes function 920 may alternate between the two options above.

When building block stripes, it is possible that a block stripe will have one or more page stripes in which the physical page that would otherwise be selected to hold the parity page of a page stripe is retired. In such cases, a deterministic placement rule can be implemented in which the parity page of the page stripe will be placed into the next non-retired physical page of the same page stripe (where the next non-retired physical page wraps around back to the beginning of the page stripe if a non-retired physical page is not found toward the end of the page stripe).

It should also be noted that some NAND flash chips may enforce additional limitations on page retirement. For example, an MLC flash memory may permit an upper page to be retired at any time, while permitting the lower page to be retired only in conjunction with the corresponding upper page.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As has been described, in at least one embodiment, a non-volatile memory array including a plurality of blocks each including a plurality of physical pages is controlled by a controller. The controller implements a plurality of nested page retirement classes each defined by a respective one of a plurality of different nested subsets of page indices of physical pages within the plurality of blocks that are to be considered retired from use. For each block among the plurality of blocks, the controller updating an indication of a page retirement class to which the block belongs in response to detection of a retirement-causing error in a data page stored in a physical page of the block. The controller forms block stripes for storing data from the plurality of blocks based on the page retirement classes of the blocks.

In at least one embodiment, a data storage system includes a controller that controls a non-volatile memory array including a plurality of blocks each including a plurality of physical pages. The controller implements multiple pattern-based page retirement classes, where each of a plurality of the pattern-based page retirement classes is defined by a respective one of a plurality of different patterns of page indices of physical pages within the plurality of blocks that are to be considered retired from use. For each block among the plurality of blocks, the controller updates an indication of a page retirement class to which the block belongs in response to detection of a retirement-causing error in a data page stored in a physical page of the block. The controller forms block stripes for storing data from the plurality of blocks based on at least the page retirement classes of the blocks.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude energy per se, transmission media per se, and transitory propagating signals per se.

In addition, although embodiments have been described that include use of a NAND flash memory, it should be appreciated that embodiments of the present invention can also be used with other types of non-volatile random access memory (NVRAM) including, for example, phase-change memory (PCM) and combinations thereof.

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method in a data storage system including a non-volatile memory array controlled by a controller, wherein the non-volatile memory array includes a plurality of blocks each including a plurality of physical pages, the method comprising:

the controller implementing multiple pattern-based page retirement classes, wherein each of a plurality of the pattern-based page retirement classes is defined by a respective one of a plurality of different patterns of page indices of physical pages within the plurality of blocks that are to be considered retired from use;

for each block among the plurality of blocks, the controller updating an indication of a page retirement class to which the block belongs in response to detection of a retirement-causing error in a data page stored in a physical page of the block; and the controller forming block stripes for storing data from selected ones of the plurality of blocks identified in ready-to-use queues based on at least the page retirement classes of the blocks.

2. The method of claim 1, wherein the multiple pattern-based page retirement classes include a catch-all page retirement class for blocks having a pattern of retired pages not matching a definition of any of the plurality of pattern-based page retirement classes.

3. The method of claim 1, and further comprising:
initializing definitions of the multiple pattern-based page retirement classes based on characterization data.

4. The method of claim 3, and further comprising:
for each of a plurality of page indices, maintaining in a respective one of a plurality of page retirement counters a count value representing a number of page retirements for that page index across the plurality of blocks; and
dynamically updating definitions of the plurality of pattern-based page retirement classes based on count values of the plurality of page retirement counters.

5. The method of claim 1, wherein:
the controller implementing a plurality of different health grades associated with various ones of the plurality of blocks having no physical pages retired from use; and
the controller forming block stripes from the blocks having no retired pages based on their associated health grades.

6. The method of claim 1, wherein:
the method further comprises the controller implementing a plurality of sets of ready-to-use queues each including a respective ready-to-use queue for each of the plurality of pattern-based page retirement classes and one or more health grades for blocks having no physical pages retired from use; and
the forming includes forming block stripes by drawing blocks from selected ready-to-use queues in the plurality of sets of ready-to-use queues, wherein at least one block stripe is formed of blocks drawn from one or more ready-to-use queues associated with a pattern-based page retirement class and drawn from one or more ready-to-use queues associated with a health grade.

7. The method of claim 1, and further comprising:
the controller implementing a plurality of sets of ready-to-use queues each including a respective ready-to-use queue for each of the plurality of pattern-based page retirement classes; and
in response to inability to form a block stripe entirely from blocks belonging to a single one of the plurality of page retirement classes, forming the block stripe from blocks belonging to two or more pattern-based page retirement classes such that a number of blocks belonging to a first pattern-based page retirement class is great enough to satisfy a first threshold and a number of blocks belonging to a second pattern-based page retirement class is low enough to satisfy a second threshold.

8. A data storage system, comprising:
a controller configured to be coupled to a non-volatile memory array including a plurality of blocks each including a plurality of physical pages, wherein the controller implements multiple pattern-based page retirement classes where each of a plurality of the pattern-based page retirement classes is defined by a respective one of a plurality of different patterns of page indices of physical pages within the plurality of blocks that are to be considered retired from use, and wherein the controller, for each block among the plurality of blocks, updating an indication of a page retirement class to which the block belongs in response to detection of a retirement-causing error in a data page stored in a physical page of the block, and wherein the controller forms block stripes for storing data from selected ones of the plurality of blocks identified in ready-to-use queues based on at least the page retirement classes of the blocks.

9. The data storage system of claim 8, wherein the multiple pattern-based page retirement classes include a catch-all page retirement class for blocks having a pattern of retired pages not matching a definition of any of the plurality of pattern-based page retirement classes.

10. The data storage system of claim 8, wherein the controller initializes definitions of the multiple pattern-based page retirement classes based on characterization data.

11. The data storage system of claim 10, and further comprising:
a plurality of page retirement counters each storing a count value representing a number of page retirements for a respective corresponding page index across the plurality of blocks;
wherein the controller dynamically updates definitions of the plurality of pattern-based page retirement classes based on count values of the plurality of page retirement counters.

12. The data storage system of claim 8, wherein:
the controller implements a plurality of different health grades associated with various ones of the plurality of blocks having no physical pages retired from use; and
the controller forms block stripes from the blocks having no retired pages based on their associated health grades.

13. The data storage system of claim 8, and further comprising:
a plurality of sets of ready-to-use queues each including a respective ready-to-use queue for each of the plurality of pattern-based page retirement classes and one or more health grades for blocks having no physical pages retired from use; and
the controller forms block stripes by drawing blocks from selected ready-to-use queues in the plurality of sets of ready-to-use queues, wherein at least one block stripe is formed of blocks drawn from one or more ready-to-use queues associated with a pattern-based page retirement class and drawn from one or more ready-to-use queues associated with a health grade.

14. The data storage system of claim 8, wherein:
the controller implements a plurality of sets of ready-to-use queues each including a respective ready-to-use queue for each of the plurality of pattern-based page retirement classes; and
the controller, responsive to inability to form a block stripe entirely from blocks belonging to a single one of the plurality of page retirement classes, forms the block stripe from blocks belonging to two or more pattern-based page retirement classes such that a number of blocks belonging to a first pattern-based page retirement class is great enough to satisfy a first threshold and a number of blocks belonging to a second pattern-based page retirement class is low enough to satisfy a second threshold.

15. The data storage system of claim 8, and further comprising the non-volatile memory array coupled to the controller.

16. A computer program product, the computer program product comprising a computer readable storage device having program instructions embodied therewith, the program instructions executable by a controller for a non-volatile memory array including a plurality of blocks each including a plurality of physical pages, to cause the controller to perform:
implementing multiple pattern-based page retirement classes, wherein each of a plurality of the pattern-based page retirement classes is defined by a respective one of a plurality of different patterns of page indices of physical pages within the plurality of blocks that are to be considered retired from use;
for each block among the plurality of blocks, updating an indication of a page retirement class to which the block belongs in response to detection of a retirement-causing error in a data page stored in a physical page of the block; and
forming block stripes for storing data from selected ones of the plurality of blocks identified in ready-to-use queues based on at least the page retirement classes of the blocks.

17. The program product of claim 16, wherein the multiple pattern-based page retirement classes include a catch-all page retirement class for blocks having a pattern of retired pages not matching a definition of any of the plurality of pattern-based page retirement classes.

18. The program product of claim 16, wherein the program code further causes the controller to perform:
initializing definitions of the multiple pattern-based page retirement classes based on characterization data.

19. The program product of claim 18, wherein the program code further causes the controller to perform:
for each of a plurality of page indices, maintaining in a respective one of a plurality of page retirement counters a count value representing a number of page retirements for that page index across the plurality of blocks; and
dynamically updating definitions of the plurality of pattern-based page retirement classes based on count values of the plurality of page retirement counters.

20. The program product of claim 16, wherein:
the program code further causes the controller to perform implementing a plurality of sets of ready-to-use queues each including a respective ready-to-use queue for each of the plurality of pattern-based page retirement classes and one or more health grades for blocks having no physical pages retired from use; and
the forming includes forming block stripes by drawing blocks from selected ready-to-use queues in the plurality of sets of ready-to-use queues, wherein at least one block stripe is formed of blocks drawn from one or more ready-to-use queues associated with a pattern-based page retirement class and drawn from one or more ready-to-use queues associated with a health grade.

* * * * *